United States Patent
Nakayama et al.

(10) Patent No.: US 6,967,519 B2
(45) Date of Patent: Nov. 22, 2005

(54) DRIVE CIRCUIT FOR A POWER SEMICONDUCTOR DEVICE

(75) Inventors: Yasushi Nakayama, Tokyo (JP); Takeshi Ohi, Tokyo (JP); Ryuichi Hashido, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 247 days.

(21) Appl. No.: 10/345,388

(22) Filed: Jan. 16, 2003

(65) Prior Publication Data

US 2003/0180997 A1 Sep. 25, 2003

(30) Foreign Application Priority Data

Jan. 17, 2002 (JP) ........................................ 2002-008596
Sep. 27, 2002 (JP) ........................................ 2002-283658

(51) Int. Cl.$^7$ ............................................. H03K 17/30
(52) U.S. Cl. ........................ 327/380; 327/381; 327/383
(58) Field of Search ................................. 327/380, 381, 327/383, 427, 434, 435, 389, 392, 393, 394, 395, 399; 361/94, 93.1, 98, 101, 93, 56

(56) References Cited

U.S. PATENT DOCUMENTS

| | | | |
|---|---|---|---|
| 4,736,267 A | * 4/1988 | Karlmann et al. | ........... 361/101 |
| 5,375,029 A | * 12/1994 | Fukunaga et al. | ........... 361/101 |
| 5,383,082 A | 1/1995 | Nishizawa | ..................... 361/93 |
| 5,621,601 A | * 4/1997 | Fujihira et al. | ............. 361/93.9 |
| 5,852,538 A | 12/1998 | Masui | ........................ 361/18 |
| 5,949,273 A | 9/1999 | Mourick et al. | ............. 327/442 |
| 5,986,484 A | 11/1999 | Kimata | ........................ 327/108 |
| 6,088,206 A | 7/2000 | Chan et al. | ................. 361/91.1 |

FOREIGN PATENT DOCUMENTS

JP    4-165916    6/1992

* cited by examiner

Primary Examiner—Tuan T. Lam
Assistant Examiner—Hiep Nguyen
(74) Attorney, Agent, or Firm—Leydig, Voit & Mayer, Ltd.

(57) ABSTRACT

A drive circuit for a power semiconductor device includes: a sampling signal generating circuit for detecting that an input control signal instructs OFF and outputting a sampling signal at the time instant of start of a Miller period of time of an IGBT; a gate voltage detecting circuit for detecting a Miller voltage of the IGBT at the timing when the sampling signal is inputted and outputting, when the Miller voltage is equal to or larger than a threshold, an over-current detection signal; and a gate voltage controlling circuit for controlling, in response to the over-current detection signal, a gate voltage of the IGBT in such a way that the IGBT is turned OFF at slower speed than in the normal state. Thus, it is possible to suppress a surge voltage which is generated when the IGBT is turned OFF during the flow of an over-current.

25 Claims, 25 Drawing Sheets

DRIVE CIRCUIT FOR A POWER SEMICONDUCTOR DEVICE

BACKGROUND OF THE INVENTION

1. Field of the Invention

The present invention relates in general to a drive circuit for a power semiconductor device. In particular, the invention relates to a drive circuit for driving a power semiconductor device such as an IGBT (Insulated-GATE Bipolar Transistor), the drive circuit serving to suppress a surge voltage which is generated when carrying out the switching operation.

2. Description of the Related Art

A description will hereinafter be given with respect to a method or protecting an IGBT from an over-current in a conventional power semiconductor device. When an over-current is caused to flow through the IGBT, a gate potential of the IGBT and a reference voltage are compared with each other by a comparator. Then, only when a gate-emitter voltage of the IGBT is increased beyond the reference voltage, the comparator operates to turn ON a switch. Thus, a gate voltage is clamped to a breakdown voltage of a Zener diode and a breakdown voltage of a diode so that a period of time up to the breakdown of the IGBT during the flow of the over-current is prolonged. By the way, even if the gate-emitter voltage is decreased, the switch which has been turned OFF once by the mono-multi operation is not turned ON again (e.g., refer to JP 4-165916A, p. 2 (Patent Document 1)).

In addition, a description will now be given with respect to one example of a drive circuits for a power semiconductor device having a protective device utilizing the increase in gate-emitter voltage during the flow of an over-current in another conventional device. The conventional device is an over-current protective device for a power device which includes a photocoupler having an input side provided between a gate of a power device provided in a load circuit and a positive electrode of a D.C. power source for gate drive in order to restrict an increase in gate voltage of the power device due to the flow of an over-current and to insulate a current on the input side due to the over-current so as to be able to output an output signal, and which serves to cut off or restrict the over-current flowing through the power device by using the output signal from the photocoupler as a detection signal for the over-current. In addition, the photocoupler includes an LED on the input side and a phototransistor on the output side (e.g., refer to JP 2614355 A (p. 3, FIG. 1 (Parent Document 2)).

In the conventional device having such a configuration, as the gate voltage is increased during the flow of an over-current, it causes the LED to conduct, and the phototransistor outputs to a control circuit a signal of the current corresponding to the conduction current through the LED, as a detection signal for an over-current. Then, the control circuit outputs a control signal so as to cut off or restrict the conduction of the power semiconductor device on the basis of the detection signal inputted thereto. In addition, the LED also serves the effect of clamping an increase in gate voltage Vge to suppress peak current of an over-current.

In the over-current detection system utilizing the increase in gate-emitter voltage typified by the above-mentioned Patent Documents 1 and 2, the gate-emitter voltage needs to be increased to some degree, and the current value at which the over-current can be detected often reaches a value which is several times as large as that of the rated current as the case may be. For this reason, when an OFF-command is issued from the outside in the state in which there is flowing a current having a level below that of the current which can be detected as the over-current even if the current is equal to or higher than the rated current of the power semiconductor device, the current caused to flow through the power semiconductor device is cut of normally. There is, as a result, the possibility that a surge voltage which is generated in cutting off a current is increased to cause destruction of the device. In particular, in the case where the current increase rate di/dt is low when short-circuit occurs in a place remote from a power semiconductor device, and so forth, there is encountered the problem that since it takes a time until the gate-emitter voltage reaches the detection level, the probability that an OFF-command is issued from the outside during that period of time is increased, thereby increasing the possibility that the device is destroyed.

SUMMARY OF THE INVENTION

In the light of the foregoing, the present invention has been made in order to solve the above-mentioned problems associated with the prior art and it is, therefore, an object of the present invention to obtain a drive circuit for a power semiconductor device which is capable of carrying out detection and protective cut-off of an over-current at a level of a current lower than that of a current which is so large as to cause an increase in a gate-emitter voltage as is the case with the above-mentioned prior art example.

The present invention relates to a drive circuit for driving a power semiconductor device, including: a switching circuit for receiving as its input an input control signal from the outside to carry out switching of ON/OFF of the power semiconductor device; a sampling signal generating circuit for detecting the input control signal to output, when the input control signal commands OFF, a sampling signal substantially at the time instant of start of a Miller period of time of the power semiconductor device; a gate voltage detecting circuit connected to a gate line of the power semiconductor device for detecting a Miller voltage of the power semiconductor device at the timing when the sampling signal is inputted thereto and outputting, when the Miller voltage is equal to or larger than a predetermined threshold, an over-current detections signal; and a gate voltage controlling circuit connected to the gate line of the power semiconductor device for controlling, in response to the over-current detection signal from the gate voltage detecting circuit, the gate voltage of the power semiconductor device in such a way that the power semiconductor device is turned OFF at slower speed than in the normal case.

BRIEF DESCRIPTION OF THE DRAWINGS

The above and other objects as well as advantages of the present invention will become clear by reading and understanding the following description of the preferred embodiments of the present invention with reference to the accompanying drawings, wherein.

DETAILED DESCRIPTION OF THE PREFERRED EMBODIMENTS

The preferred embodiments of the present invention will hereinafter be described in detail with reference to the accompanying drawings.

First Embodiment

The present invention is structured in such a way as to adjust a waveform or a gate voltage, on and after cutting off a current, based on a value of a current which is caused to flow through a power semiconductor device in order to suppress generation of a surge voltage. Thus, in order to estimate the value of the current caused to flow through the power semiconductor device, a gate voltage (Miller voltage) of the power semiconductor device on and after turning OFF the power semiconductor device is detected. Moreover, with the structure of the present invention, the detection timing is adjusted by a sampling signal generating circuit using an input control signal.

Figure 1:
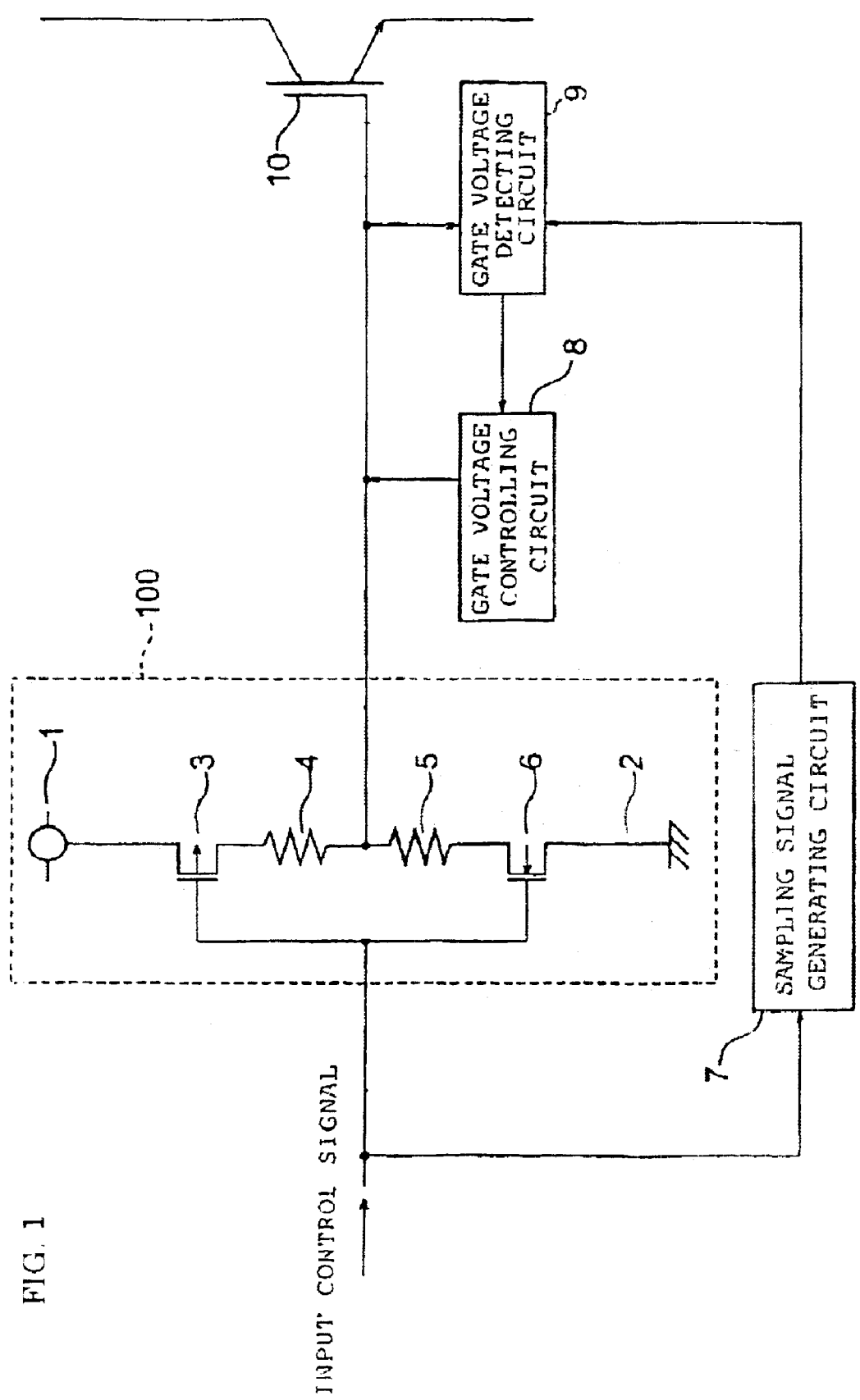
FIG. 1 is a circuit diagram showing a configuration of a drive circuit for a power semiconductor device according to a first embodiment of the present invention.

FIG. 1 is a circuit diagram showing a configuration of a drive circuit for a power semiconductor device according to a first embodiment of the present invention. In FIG. 1, reference numeral 100 designates a main inverter circuit for switching ON/OFF of a power semiconductor device; reference numeral 7, a sampling signal generating circuit for referring to a signal from an input control signal to generate a sampling signal only when turning OFF the power semiconductor device; reference numeral 8, a gate voltage controlling circuit connected to a gate line of the power semiconductor device for controlling a gate voltage on the basis of the detection result obtained from a gate voltage detecting circuit as will be described below; reference numeral 9, the gate voltage detecting circuit connected to the gate line of the power semiconductor device for detecting a gate voltage at the time when receiving as its input the sampling signal; and reference numeral 10, the power semiconductor device which is an object to be driven by the drive circuit of the present invention. Then, in this embodiment, the power semiconductor device will hereinbelow be described by giving an IGBT as an example (hereinafter, referred to as "IGBT 10"). In addition, reference numeral 1 designates a power source, reference numeral 2 designate the earth, reference numeral 3 designates a P-channel MOSFET, reference numerals 4 and 5 respectively designate resistors, and reference numeral 6 designates an N-channel MOSFET.

Then, these constituent elements 1 to 6 are provided in the main inverter 100. It should be noted that, while in this embodiment, the description is given with respect to an example in which the main inverter 100 is constituted by the power source 1, the earth 2, the P-channel MOSFET 3, the resistors 4 and 5, and the N-channel MOSFET 6 as shown in FIG. 1, the present invention is not intended to be limited thereto. That is to say, any other configuration may be available as long as the main inverter 100 has the function as the inverter therein. Also, if the logic is changed, then the configuration for a buffer may also be available.

The operation hereinbelow of the circuit of FIG. 1 is now described. First of all, at the time when the input control signal is input to the main inverter 100, the sampling signal generating circuit 7 refers to the input control signal to generate, in the case of turn-OFF, the sampling signal after a lapse of a predetermined period of time (so as to be near the start of a Miller time period). On the other hand, in the case of turn-ON, the sampling signal generating circuit generates no signal. Thus, the gate voltage detecting circuit can be operated only in the case of turn-OFF. Next, at the time when the sampling signal is input to the gate voltage detecting circuit 9, the gate voltage detecting circuit 9 detects the gate voltage (i.e., the Miller voltage). When the gate voltage detecting circuit 9 detects that an over-current is flowing through the IGBT 10, a predetermined over-current detection signal is output to the gate voltage controlling circuit 8, thereby providing feedback thereto. This occurs only when an over-current flowing, i.e., the gate voltage is feedback-controlled to cut off slowly the IGBT 10. In addition, since the drive circuit is configured in such a way that the sampling signal generating circuit 7 generates the sampling signal at a time instant near the start of the Miller time period, normally, the IGBT 10 is speedily turned OFF by the action of both of the gate voltage detecting circuit 9 and the gate voltage controlling circuit 8. Thus, the turn-OFF loss is less and the gate voltage is controlled in such a way that during the flow of an over-current, the IGBT 10 can be slowly cut off. This makes it possible to reduce a surge voltage which is generated when turning OFF the IGBT 10.

Figure 2:
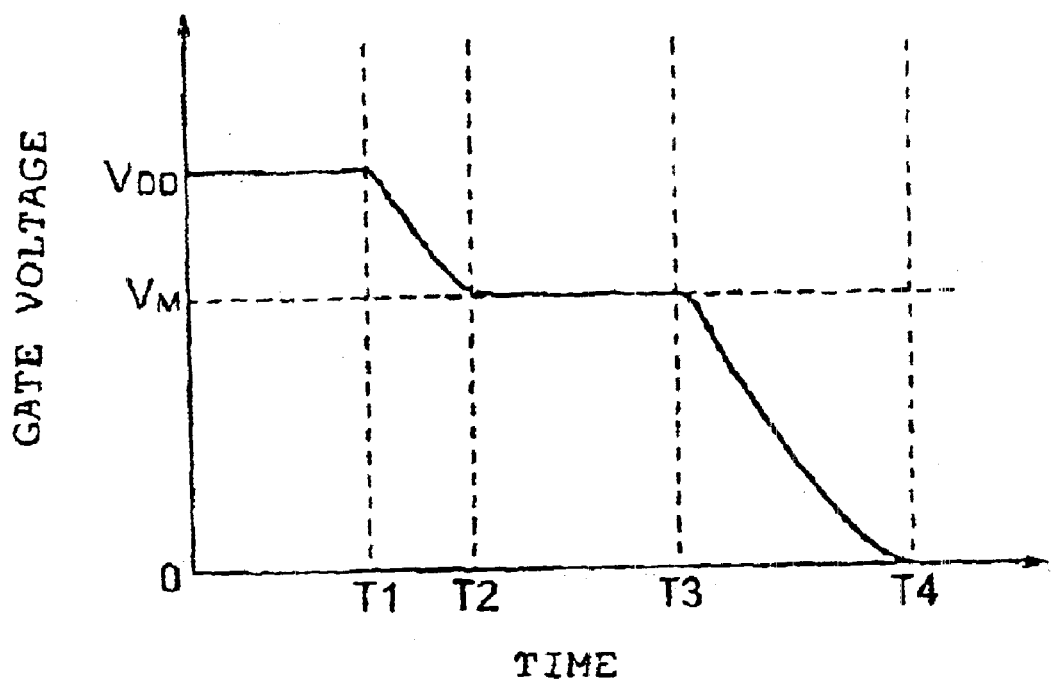
FIG. 2 is a diagram for explaining a waveform of a gate voltage upon turning OFF an IGBT.
Figure 3:
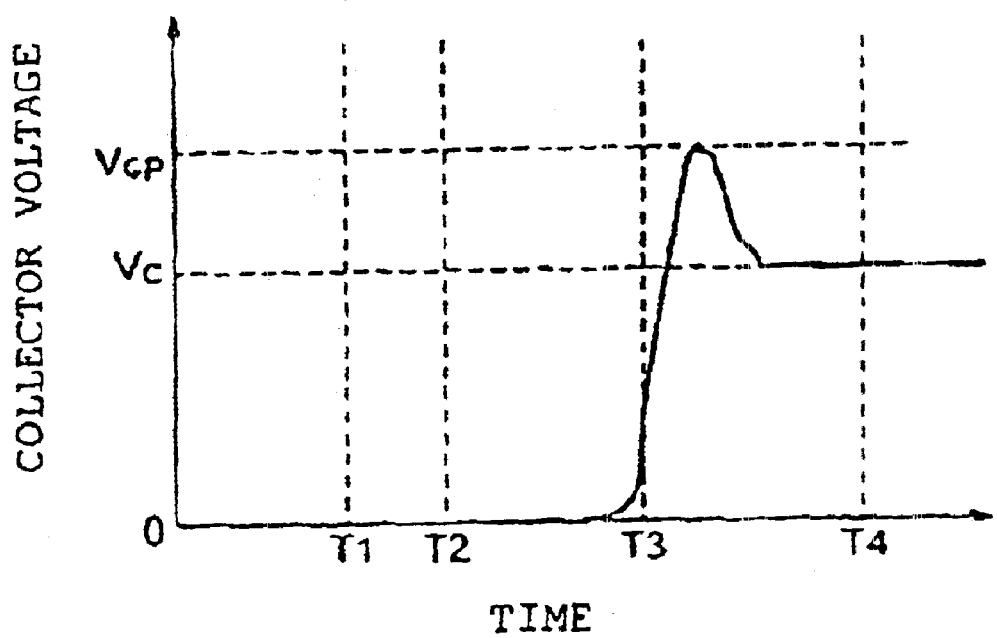
FIG. 3 is a diagram useful in explaining a waveform of a collector voltage upon turning OFF an IGBT.
Figure 4:
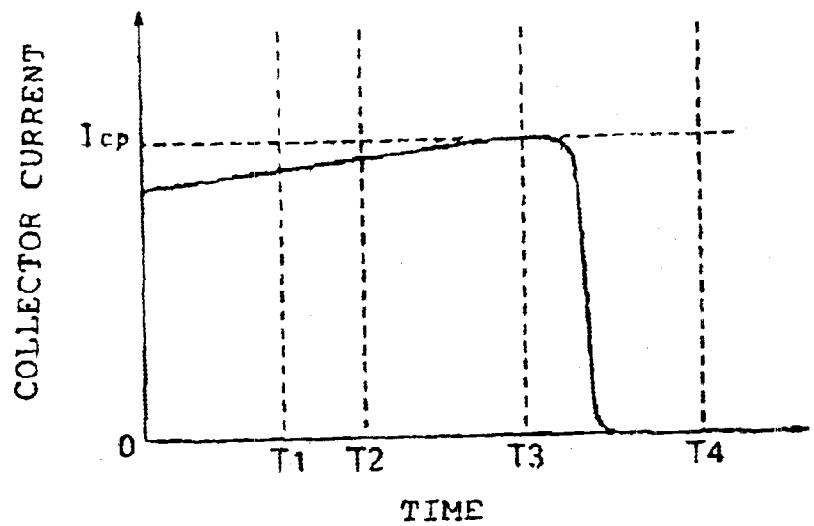
FIG. 4 is a diagram useful in explaining a waveform of a collector current upon turning OFF an IGBT.

Now, a gate waveform, a collector voltage waveform, and a collector current waveform on and after turning OFF the IGBT 10 are respectively shown in FIG. 2, FIG. 3, and FIG. 4.

The operation on and after turning OFF the IGBT 10 will hereinbelow be described in more detail with reference to FIGS. 2 to 4. First of all, a signal at a HIGH level is inputted to the input terminal of the main inverter 100 at time T1 in order to turn OFF the IGBT 10. Thus, since the switch 3 is turned OFF and the switch 6 is turned ON, the electric charges accumulated in the capacitor between the gate and the emitter of the IGBT 10 are discharged to the earth 2 through the resistor 5 and the switch 6. The discharge current at this time depends on the resistance value of the resistor 5, since the ON-resistance of the switch 6 is sufficiently low. Then, the gate voltage begins to be decreased as shown in FIG. 2.

At time T2, a displacement current passing through the feedback capacitor present between the gate and the collector of the IGBT 10 begins to flow from the gate of the IGBT 10. Thus, since the, discharge from the capacitor between the gate and emitter has stopped, as shown in FIG. 2, the gate voltage decreases to a fixed, almost constant voltage, $V_M$.

As time T3 approaches, as shown in FIG. 3, the collector voltage of the IGBT 10 begins to be increased.

When the time passes point T3, since the electric charge accumulated in the capacitor between the gate and the emitter of the IGBT 10 discharges again, depending on the resistance value of the resistor 5, as shown in FIG. 2, the gate voltage begins to decrease. During this period of time, the collector current is abruptly cut off, as shown in FIG. 4.

Now, a parasitic inductance Ls is necessarily present in the wiring of a main circuit such as an inverter including the IGBT 10. Thus, a surge voltage (Vcp−Vc=Ls×dIc/dt) is generated at the collector terminal of the IGBT 10 due to the abrupt cut-off of the collector current. Thus, after once the collector voltage, as shown in FIG. 3, has reached a peak voltage Vcp, it is decreased down to a steady value Vc.

Therefore, since the discharge of the electric charges accumulated in the capacitor between the gate and the emitter of the IGBT 10 has been completed at time T4, the gate voltage becomes 0V.

Thus, when the cut-off is carried out when an over-current is being caused to flow through the IGBT 10, a surge voltage with a magnitude larger than that in the normal case is generated, which exceeds the withstand voltage of the IGBT 10 to destroy the IGBT 10.

In the present invention, the present inventors and associated persons pay special attention to a period of time from time T2 to time T3 (hereinafter, referred to as the "Miller time period" for the convenience of explanation) and gate voltage during that Miller time period (hereinafter, referred to as the "Miller voltage, sometimes referred to as $V_M$" for the convenience of explanation). Whenever the IGBT 10 is turned OFF, the Miller time period (for which the gate voltage becomes constant at the Miller voltage $V_M$) necessarily exists, and the collector current begins to decrease at the end of that Miller time period, and the Miller voltage increases, depending on the magnitude of the collector current of the IGBT 10.

Then, if the Miller voltage is detected and the current of interest is judged to be an over-current when the magnitude thereof is larger than a predetermined value, and also the gate voltage is controlled so as to be able to cut off slowly the over-current, then it is possible to reduce the surge voltage which is generated when turning OFF the IGBT 10. In this method, normally, the turn-OFF can be speedily carried out and hence the loss can also be reduced. In addition, since the period of time up to the Miller period of time is short similarly to the normal state during the flow of the over-current, the delay hardly occurs in the control. Also, since the over-current is slowly cut off on and after the Miller period of time, the occurrence of the surge voltage is also suppressed and it is, as a result, possible to protect the IGBT 10. In addition, according to the present invention, the Miller voltage during the turn-OFF state which depends on the collector current is detected and then judgement is made as to, on the basis of the detected value, whether or not the current of interest is an over-current. That is to say, since the over-current detection level can be adjusted on the basis of the Miller voltage value, the current the magnitude of which is smaller than that in the case of the conventional method of detecting the rise of the gate voltage can be detected as an over-current.

In the present invention, as shown in FIG. 1, the sampling signal generating circuit 7 is provided so that the gate voltage detecting circuit is operated only in the turn-OFF state by referring to the input control signal.

In addition, the sampling signal generating circuit 7 has the function of adjusting the sampling time to the vicinity of start of the Miller period of time. In response to the generated sampling signal, the gate voltage detecting circuit 9 can detect the Miller voltage at that time.

Only when the gate voltage detecting circuit 9 detects that an over-current is being caused to flow through the IGBT 10, the feedback is provided to the gate voltage controlling circuit 8. Thus, the gate voltage is controlled only during the flow of the over-current so that the IGBT 10 is slowly cut off. It is, as a result, possible to suppress a surge voltage which is generated when turning OFF the IGBT 10 to a small level and also it is possible to prevent the destruction of the IGBT 10 due to the occurrence of the surge voltage.

As described above, according to this embodiment, since the sampling, signal generating circuit 7, the gate voltage detecting circuit 9, and the gate voltage controlling circuit 8 are provided, the gate voltage detecting circuit 9 is operated only in the turn-OFF state. In addition, since the IGBT 10 is speedily turned OFF in a normal state, the turn-OFF loss is less. In addition, since the adjustment of the Miller voltage detection level enables the over-current detection level to be changed, the over-current is detected even in the case where the current is not the conventional large current, but the small current so that the over-current protection for suppressing generation of a surge voltage can be carried out.

Second Embodiment

Figure 5:
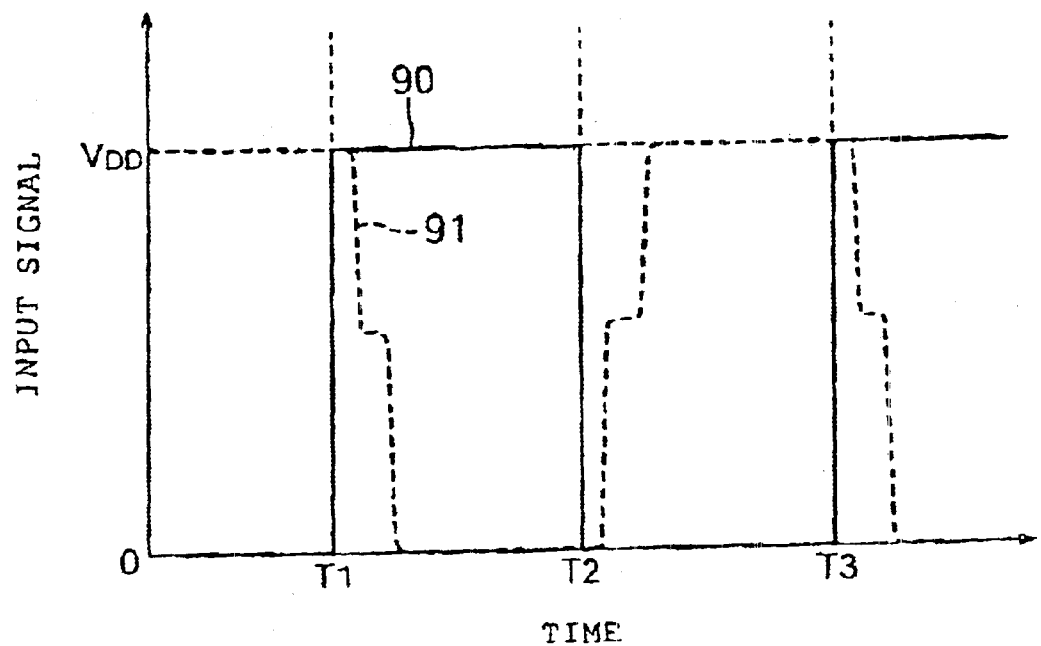
FIG. 5 is a diagram useful in explaining waveforms of an input control signal and a gate voltage in a second embodiment of the present invention.
Figure 6:
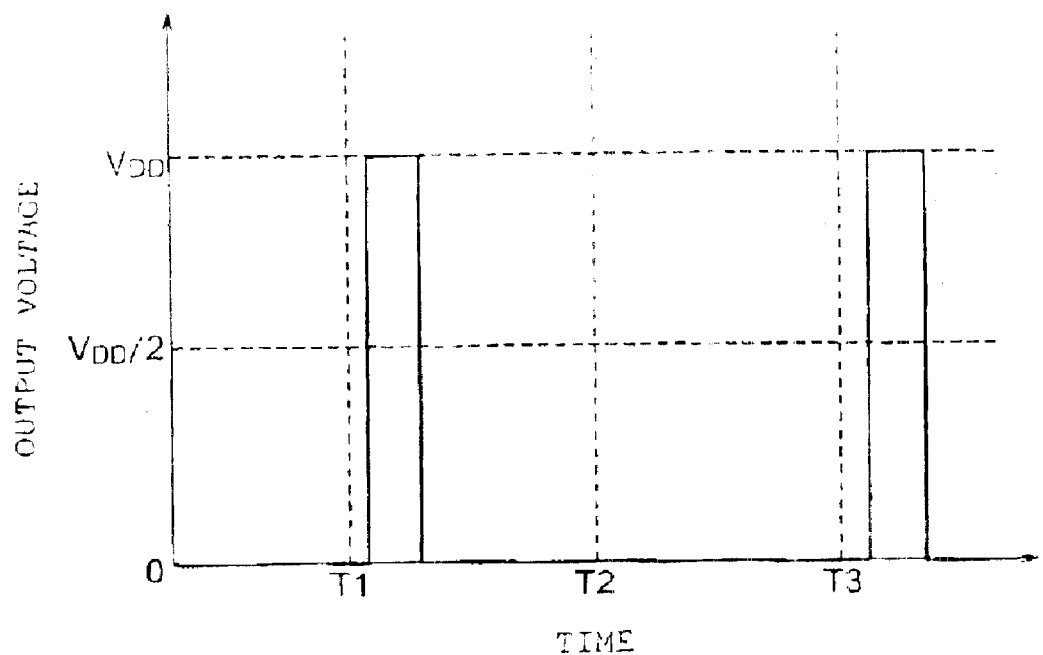
FIG. 6 is a diagram useful in explaining sampling waveforms in the second embodiment of the present invention.

As an example of a configuration of the sampling signal generating circuit 7 of the above-mentioned first embodiment, there is a method of employing an ASIC. In this case, an arbitrary waveform can be formed. For example, when an input control signal 90 indicated by a solid line of FIG. 5 is inputted to the driver, a gate voltage 91 has a waveform as indicated by a broken line of FIG. 5. Since the above-mentioned circuit of the present invention has only to be operated only in the turn-OFF state, the ASIC may output an output voltage having a waveform as shown in FIG. 6.

In this embodiment as well, the same effects as those of the above-mentioned first embodiment can be obtained.

Third Embodiment

Figure 7:
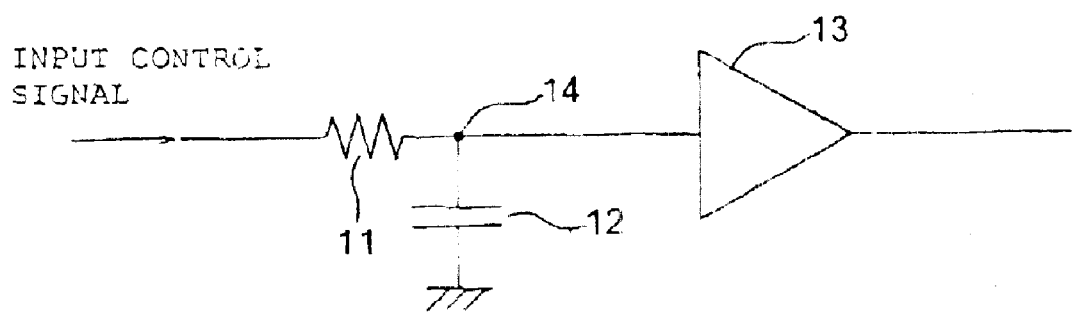
FIG. 7 is a circuit diagram showing a configuration of a sampling signal generating circuit according to a third embodiment of the present invention.
Figure 8:
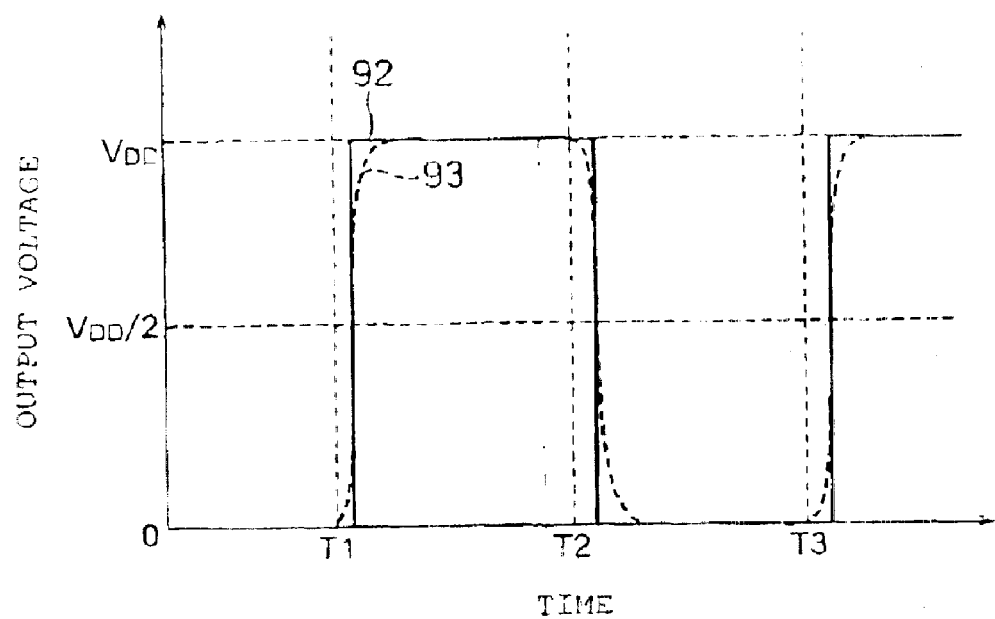
FIG. 8 is a diagram useful in explaining a sampling waveform in the third embodiment of the present invention.

FIG. 7 shows an example of a sampling signal generating circuit 7 different from that in the above-mentioned second embodiment. In FIG. 7, reference numeral 11 designates a resistor, reference numeral 12 designates a capacitor, reference numeral 13 designates a buffer, and reference numeral 14 designates a node. As shown in FIG. 7, the resistor 11 is provided on the input side of an input control signal, and the buffer 13 is provided on the side of the gate voltage detecting circuit 9. The resistor 11 and the buffer 13 are connected to each other, and the capacitor 12 is connected between the node 14 provided between the resistor 11 and the buffer 13, and the earth. Since the resistor 11 and the capacitor 12 constitute a low-pass filter, when the input control signal as shown in FIG. 5 is inputted, the waveform of a voltage 93 (indicated by a dotted line) at the node 14 becomes the dull waveform as shown in FIG. 8 (i.e., the waveform in which the change at a change point is gentle). Here, the threshold voltage of the buffer 13 is made $V_{DD}/2$ as one half the input and the voltage developed at the node 14 is inputted to the buffer, thereby obtaining a rectangular wave 92 as shown in FIG. 8. This rectangular wave 92 forms a signal which is delayed with respect to the input control signal 90 shown in FIG. 5 by a fixed period of time, and this delay time can be adjusted by changing either the resistance value of the resistor 11 or the capacitance value of the capacitor 12. In addition, this method has the superior advantage that the cost thereof is lower than that in the case where the ASIC is employed. It should be noted that, since the delay time can be arbitrarily adjusted, the threshold voltage of the buffer 13 does not need to be rigidly $V_{DD}/2$.

As described above, according to this embodiment, since the sampling signal generating circuit 7 shown in FIG. 1 is constituted by the delay circuit having the resistor 11 and the capacitor 12, and the buffer 13, it is possible to reduce the cost thereof. In addition, changing either the resistance value of the resistor 11 or the capacitance value of the capacitor 12 makes it possible to adjust arbitrarily the delay time.

Fourth Embodiment

In the case of the above-mentioned third embodiment, the delay time when the level is changed from HIGH to LOW becomes identical to the delay time when the level is changed from LOW to HIGH. Thus, when the time instant at which the Miller period of time in the turn-ON state begins is sufficiently earlier than the time instant at which the Miller period of time in the turn-OFF state begins, there is encountered the problem that if the circuit according to the above-mentioned third embodiment is used, the sampling is carried out even in the turn-ON state.

Figure 9:
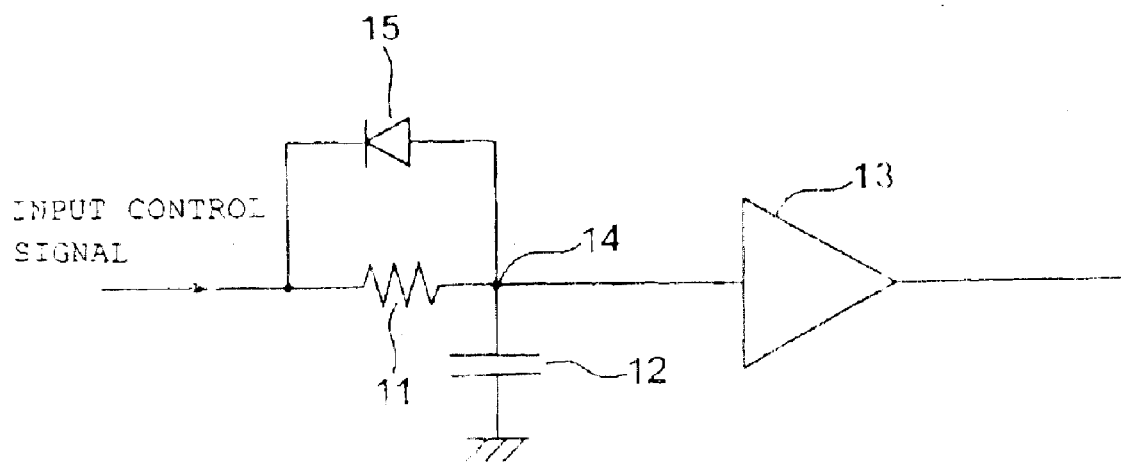
FIG. 9 is a circuit diagram showing a configuration of a sampling signal generating circuit according to a fourth embodiment of the present invention.
Figure 10:
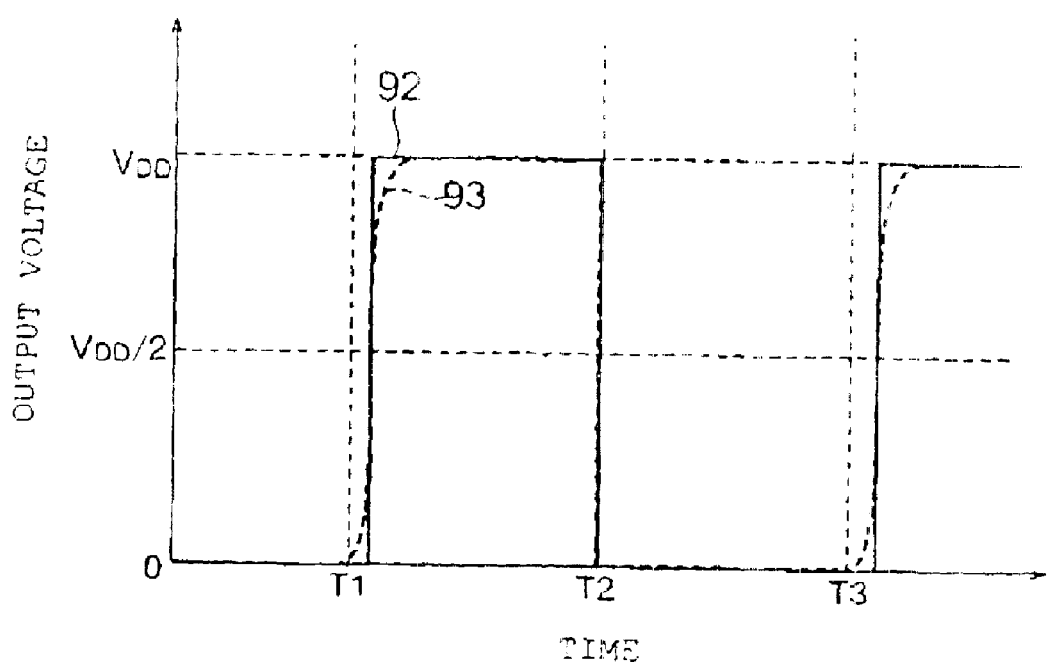
FIG. 10 is a diagram useful in explaining a sampling waveform in the fourth embodiment of the present invention.

FIG. 9 shows an example of the sampling signal generating circuit 7 according to a fourth embodiment. In FIG. 9, in addition to the constituent elements of the circuit of the third embodiment shown in FIG. 7, a diode 15 is additionally connected in a direction shown in FIG. 9. That is to say, the diode 15 is connected so as to be parallel with the resistor 11 and also so as to make the direction of the input control signal the forward direction. Since the current is caused to flow through the diode 15 only in the forward direction, only when the electric charges are discharged from the capacitor 12, i.e., only when the level of the input control signal is changed from HIGH to LOW, the discharge current is caused to flow through the diode 15. Thus, since in this embodiment, the electric charges can be fiery speedily discharged as compared with the case of the third embodiment in which the electric charges are discharged through the resistor 11, there is hardly the delay time in discharge. Thus, as shown in FIG. 10, there is obtained the sampling signal which is delayed only when the level is changed from LOW to HIGH and is in synchronism with the input signal when the level is changed from HIGH to LOW.

If this circuit is used, since when turning OFF the IGBT 10, the sampling signal is generated with a delay of a fixed period of time, whereas since when turning ON the IGBT 10, the circuit is turned OFF in synchronism with the input control signal, no sampling is carried out. This results in that the more accurate sampling signal can be obtained as compared with the first embodiment.

As described above, according to this embodiment, as in the third embodiment, since the above-mentioned sampling signal generating circuit 7 is constituted by the delay circuit having the resistor 11 and the capacitor 12, and the buffer 13, it is possible to reduce the cost thereof. In addition, changing either the resistance value of the resistor 11 or the capacitance value of the capacitor 12 makes it possible to adjust arbitrarily the delay time.

In addition, since in this embodiment, the sampling signal generating circuit 7 further includes the diode 15 which is connected so as to be parallel with the above-mentioned resistor 11 and also so as to make the direction of the input control signal a forward direction, the sampling signal generating circuit 7 can operate synchronously with the input control signal when the level of the input control signal is changed from HIGH to LOW. Consequently, it is possible to surely prevent the sampling signal generating circuit from operating when turning ON the power semiconductor device.

Fifth Embodiment

Figure 11:
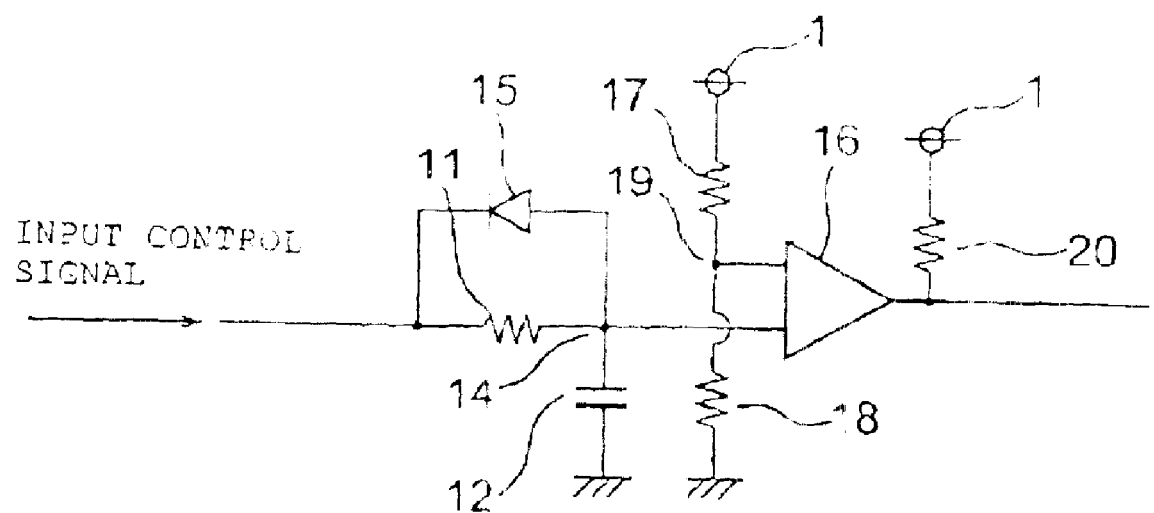
FIG. 11 is a circuit diagram showing a configuration of a sampling signal generating circuit according to a fifth embodiment of the present invention.

FIG. 11 shows an example of the sampling signal generating circuit 7 as a fifth embodiment. In this embodiment, instead of the buffer 13 in the third and fourth embodiments, there is provided a comparator 16, and a reference circuit including resistors 17 and 18. In FIG. 11, reference numeral 16 designates the comparator, reference numerals 17 and 18 respectively designate the resistors which are provided in the preceding stage of the comparator 16 for dividing the voltage of the power source 1, and reference numeral 20 designates a resistor which is provided in the subsequent stage of the comparator 16 and between the comparator 16 and the power source 1. Since other constituent, elements are the same in configuration as those of the above-mentioned embodiments, the description thereof is omitted here for the sake of simplicity. If the level of the input control signal is switched from LOW to HIGH when turning OFF the IGBT 10, the capacitor 12 is charged. At the time when the voltage at the node 14 inputted to the comparator 16 becomes higher than that at a node 19 which is obtained by dividing the voltage of the power source 1 of the reference circuit with the resistors 17 and 18, the comparator 16 outputs a sampling signal. The delay time of the output of the sampling signal may be adjusted by changing either the resistance value of the resistor 11 or the capacitance value of the capacitor 12, or may be adjusted by changing the resistance values of the resistors 17 and 18 of the reference circuit to adjust the voltage of the reference circuit.

When the buffer is used as in the third embodiment, there is the possibility that the delay time of the output of the sampling signal may vary due to the variation of the threshold of the buffer. However, when the comparator is used as in this embodiment, it is possible to reduce the variation of the output of the sampling signal and also it is possible to prevent the drive circuit from undergoing the malfunction.

As described above, according to this embodiment, since the sampling signal generating circuit 7 is constituted by the reference circuit having the resistors 17 and 18 for outputting a predetermined reference voltage which is previously set, the delay circuit having the resistor 11 and the capacitor 12, and the comparator 16 (voltage comparator) for detecting whether the level of the output voltage of the delay circuit is higher or lower than that of the reference voltage, it is possible to reduce the variation of the delay time of the output of the sampling signal and also it is possible to prevent the drive circuit from undergoing the malfunction.

Sixth Embodiment

Figure 12:
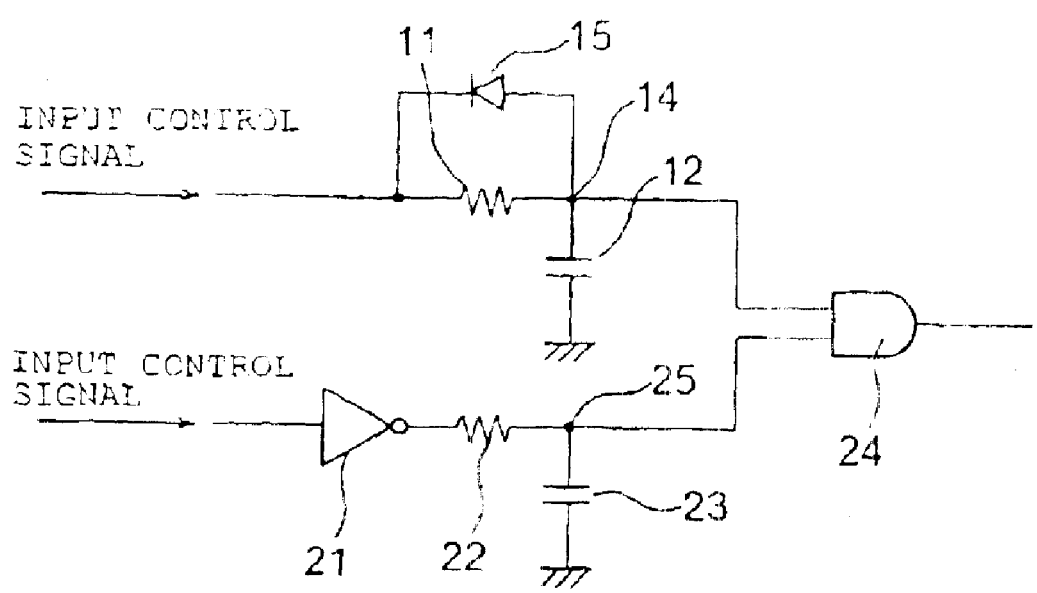
FIG. 12 is a circuit diagram showing a configuration of a sampling signal generating circuit according to a sixth embodiment of the present invention.

FIG. 12 shows an example of the sampling signal generating circuit 7 as a sixth embodiment. In addition to a first circuit having the resistor 11, the capacitor 12, and the diode 15, the sampling signal generating circuit 7 includes an inverter 21 for inverting the input control signal, a second circuit having a resistor 22 and a capacitor 23, and an AND element 24. The first circuit and the second circuit are connected in parallel with each other, and their output signals are inputted to the AND element 24. In addition, the configuration of the first circuit is the same as that in which the buffer 13 of the above-mentioned fourth embodiment is removed. With respect to the configuration of the second circuit, the resistor 22 is connected in series with the inverter 21 and the capacitor 23 is provided between a node 24 provided between the resistor 22 and one input terminal of the AND element 24, and the earth.

Figure 13:
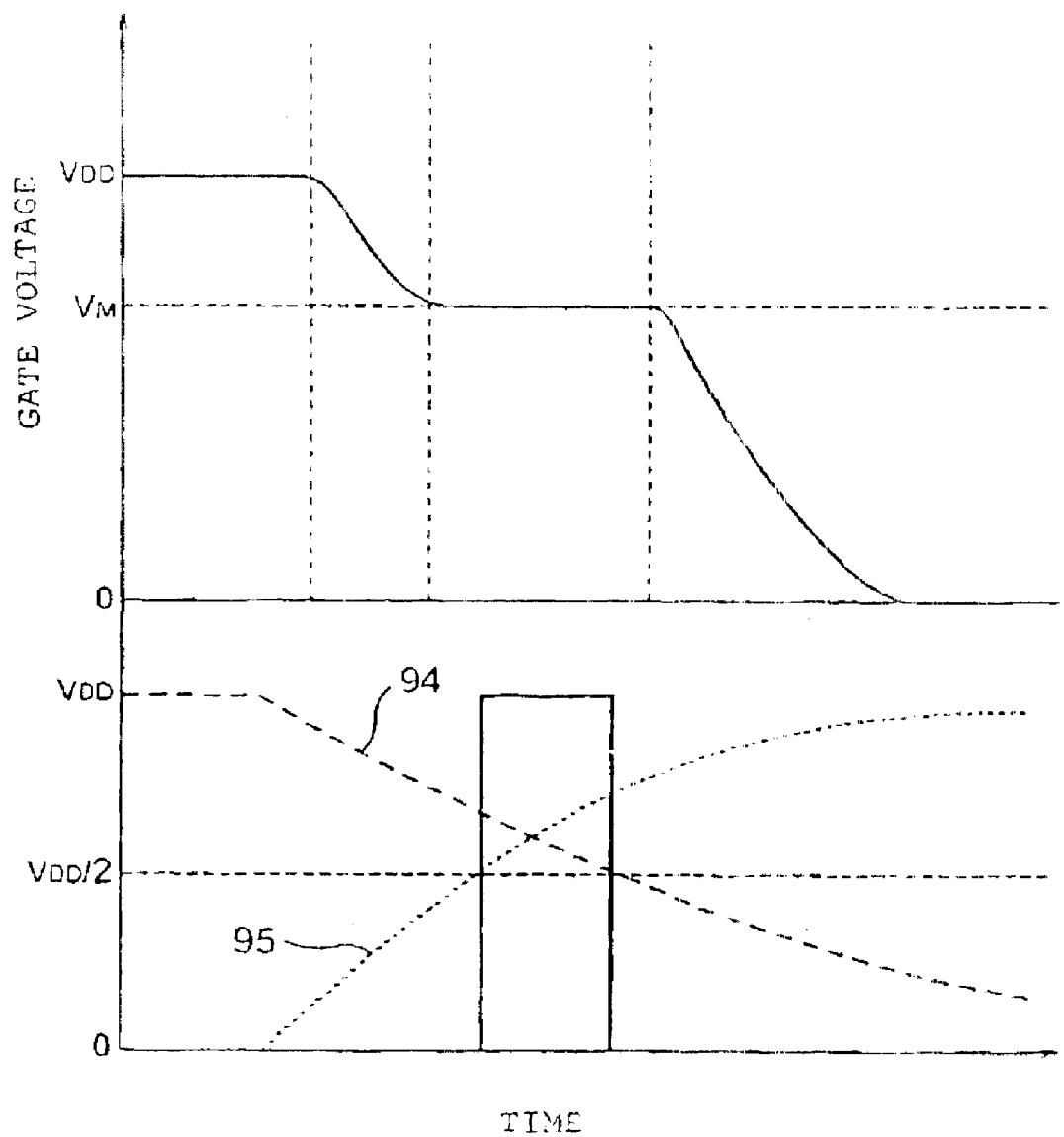
FIG. 13 is a diagram useful in explaining a sampling waveform in the sixth embodiment or the present invention.

The operation on and after turning OFF the IGBT 10 will hereinbelow be described with reference to FIG. 13. When the level of the input control signal is switched from LOW to HIGH in the turn-OFF state, the voltage at the node 14 is gradually increased to reach a threshold voltage of the AND element 24. On the other hand, the voltage at the node 25 is gradually decreased due to the provision of the inverter 21 to become lower than the threshold voltage of the AND element 24. If a period of time required for the voltage at the node 25 to be decreased to a level lower than the threshold voltage of the AND element 24 is delayed with respect to a period of time required for the voltage at the node 14 to reach the threshold voltage of the AND element 16, then the sampling signal is outputted from the AND element 24 only for that period of time defined therebetween.

As described above, in this embodiment, by adopting such a circuit configuration, it is possible to decide a period of time for outputting the sampling signal. If the period of time for outputting the sampling signal is set shorter than the Miller period of time, then it is possible to prevent the drive circuit from undergoing the malfunction due to the noise generated during decrease of the current after a lapse of the Miller period of time. In addition, there is the case that the gate voltage detecting circuit operates in the vicinity of the end of the Miller period of time and the operation of the gate voltage controlling circuit 8 is delayed. Thus, although not illustrated in FIG. 1, in the case where the detection signal when detecting an over-current is outputted to an external circuit, in spite of the actual normal cut-off, it is possible to prevent the detection signal from being outputted.

In addition, according to this embodiment, since the above-mentioned sampling signal generating circuit 7 is constituted by the delay circuit having the resistor 11 and the capacitor 12, and the circuit having the inverter 21 and the resistor 22, it is possible to reduce the cost thereof. Also, changing either the resistance value of the resistor 1 or the capacitance value of the capacitor 12 makes it possible to arbitrarily adjust the delay time.

Seventh Embodiment

Figure 14:
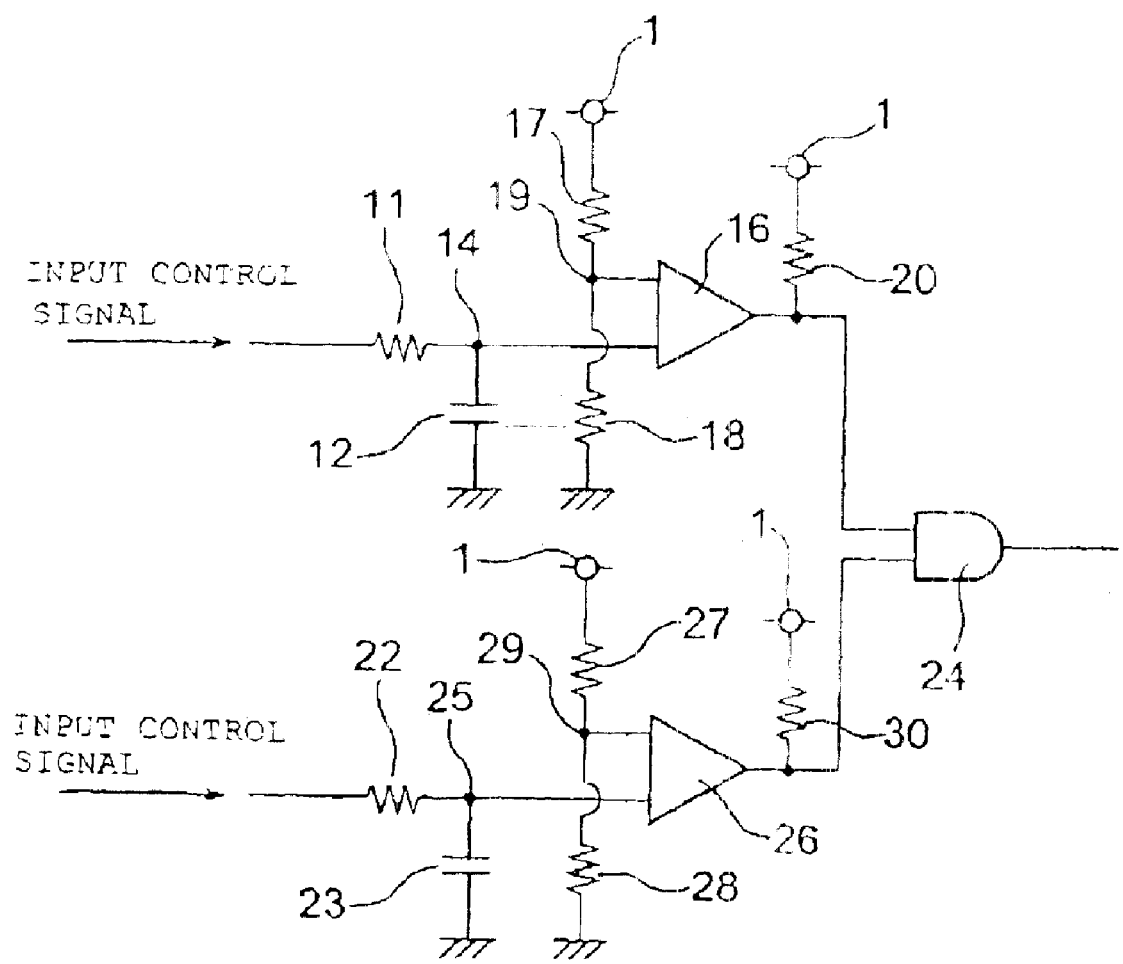
FIG. 14 is a circuit diagram showing a configuration of a sampling signal generating circuit according to a seventh embodiment of the present invention.

While in the above-mentioned sixth embodiment, the output signals are directly inputted to the AND element 24 through the nodes 14 and 25, alternatively, there may also be adopted such a configuration that comparators (refer to FIG. 11) as in the fifth embodiment are used, and their output signals are inputted to the AND element 24. FIG. 14 shows a configuration in which comparators are used and their outputs are inputted to the AND element 24. The configuration shown in FIG. 14 is such that two circuits shown in FIG. 11 from which the diodes are removed are provided in parallel with each other, and their output signals are inputted to the AND element 24. It should be noted that, while as shown in FIG. 12, an inverted input signal which is obtained through the inverter 21 may be inputted to one input terminal of the AND element 24, the terminals through which the signals are inputted to the comparator may also be replaced with that of the reference side.

In such a manner, in the case where, the comparators are used, it is possible to reduce the variation of the sampling output signal due to the variation of the threshold value of the AND element 24.

As described above, according to this embodiment, the above-mentioned sampling signal generating circuit 7 includes a first circuit having the reference circuit having resistors 17 and 18 for outputting a predetermined reference voltage which is previously set, the delay circuit having the resistor 11 and the capacitor 12, and the comparator 16 for detecting whether the output voltage of the delay circuit is larger or smaller than the reference voltage, a second circuit having the reference circuit having resistors 27 and 28 for outputting a predetermined reference voltage which is previously set, the delay circuit having the resistor 22 and the capacitor 23, and the comparator 26 for detecting whether the output voltage of the delay circuit is larger or smaller than the reference voltage, and the AND element 24 for receiving as its input the output signals from the first and second circuits. It is, as a result, possible to reduce the variation of the delay time in output of the sampling signal and also it is possible to prevent the drive circuit from undergoing the malfunction.

Eighth Embodiment

Figure 15:
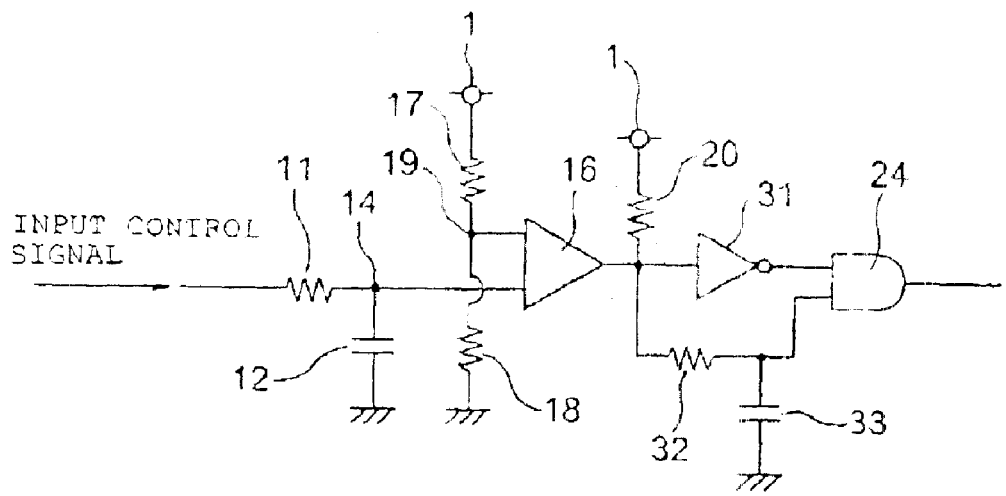
FIG. 15 is a circuit diagram showing a configuration of a sampling signal generating circuit according to an eighth embodiment of the present invention.

While in the seventh embodiment, the comparators are used in order to input their output signals to the input terminals of the AND element, alternatively, as shown in FIG. 15, there may be adopted such a configuration that only the start point of the monitor period of time is set using the comparator 16, and the end point thereof is set using a delay circuit having a resistor 32 and a capacitor 33 to which the output signal of the comparator 16 is inputted. In FIG. 15, reference numeral 31 designates an inverter, reference numeral 32 designates a resistor, and reference numeral 33 designates a capacitor. Since other constituent elements are the same in configuration as those of FIG. 11, the description thereof is omitted here for the sake of simplicity. As shown in FIG. 15, the configuration of the precedent stage portion is the same as that in which the diode is removed front the circuit shown in FIG. 11, and the signal which is obtained by inverting the output signal of the precedent stage portion through the inverter 31 is inputted to one input terminal of an AND element 24. The signal which is obtained by delaying the output signal of the comparator 16 through a delay circuit including the resistor 32 and the capacitor 33 is inputted to the other input terminal of the AND element 24.

In the case of the circuit shown in FIG. 15, the end point varies due to the variation in the AND element 24, although such variation of the end point is small as compared with the case where no comparator 16 is used. In addition, when the start point of the monitor period of time varies, a period of time when the gate voltage is at a high level is monitored, and hence there is the possibility that the drive circuit undergoes the malfunction. However, even if the end point thereof varies slightly, the possibility that the drive circuit undergoes the malfunction is less.

Ninth Embodiment

Figure 16:
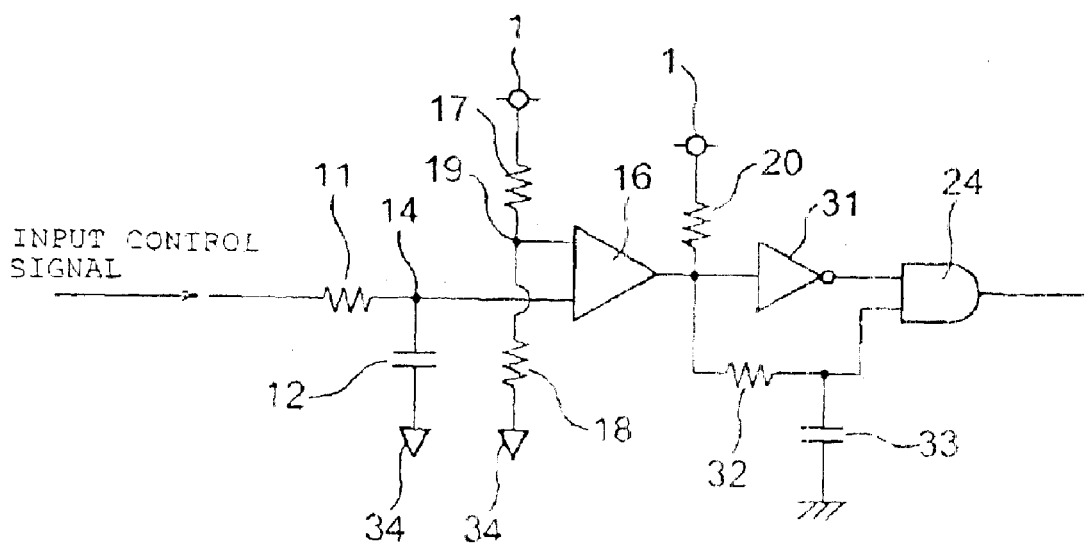
FIG. 16 is a circuit diagram showing a configuration of a sampling signal generating circuit according to a ninth embodiment of the present invention.

FIG. 16 shows another example of the sampling signal generating circuit 7 according to a ninth embodiment. One end of the capacitor 12 used in the delay circuit and one end of the resistor 18 of the reference circuit shown in FIG. 15 are not connected to the earth, but are connected to an emitter power source 34. In general, even when the power source voltage varies, the voltage variation between the power source 1 and the emitter power source 34 is less than that of the voltage of the power source 1 and hence such a power source voltage is held constant in many cases. For this reason, if one ends of the capacitor 12 and the resistor 18 of the reference circuit are connected to the emitter power source, even when the power source voltage varies, the voltage variation between the power source 1 and the emitter power source 34 is less. Thus, it is possible to output data of the monitoring period of time for fixed time. For this reason, even when the power source voltage varies, it is possible to prevent the drive circuit from undergoing the malfunction due to the variation in the monitoring period of time. It should be noted that, while the circuit is configured using the emitter power source, a power source, using a regulator and the like, which is less in voltage variation may also be used.

Tenth Embodiment

Figure 17:
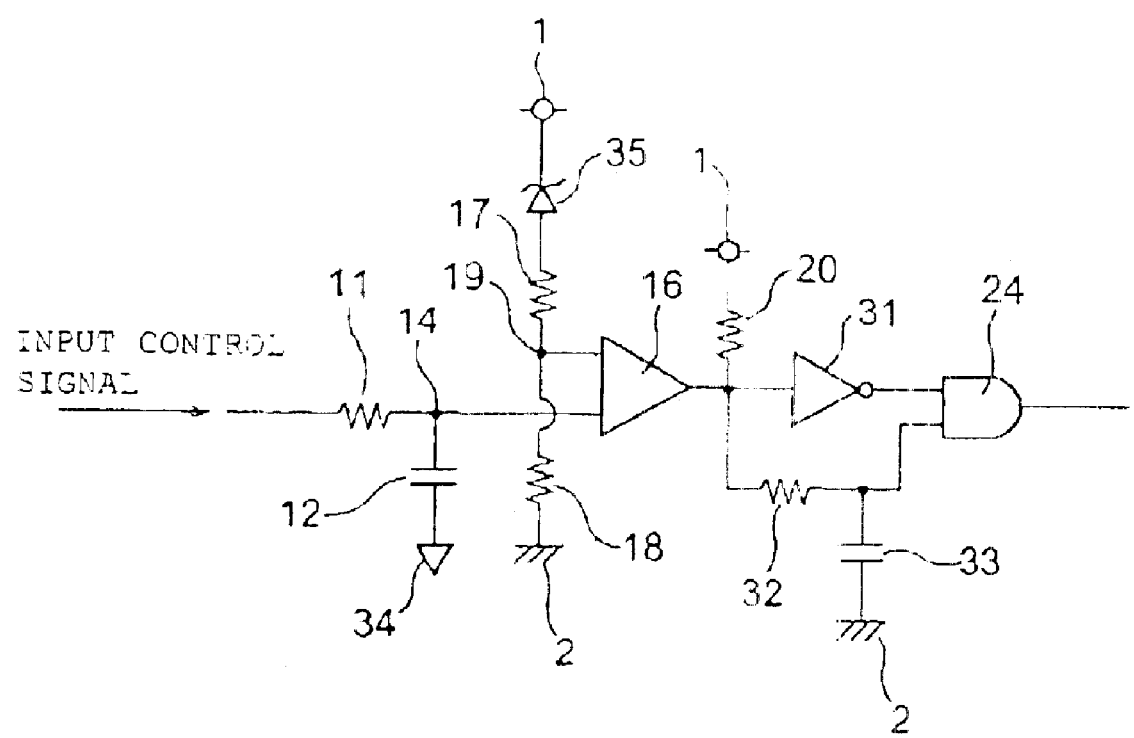
FIG. 17 is a circuit diagram showing a configuration of a sampling signal generating circuit according to a tenth embodiment of the present invention.

FIG. 17 shows another example of the sampling signal generating circuit 7 according to a tenth embodiment. When the power source voltage of the drive circuit varies, in the main inverter as shown in in FIG. 1, the operating time of the MOSFETs 3 and 6 may vary so that a period of time from a time point when an OFF command of the input control signal is issued up to a time point when the voltage is decreased may vary in some cases. The present invention has been made in order to cope with such a case. While as shown in FIG. 17, one end of the capacitor 12 is still connected to the emitter power source 34 as in the case of FIG. 16, one end of the resistor 18 of the reference circuit for the comparator 16 is connected to the earth as in the case of FIG. 15. In addition, a Zener diode 35 is provided between the resistor 17 of the reference circuit for the comparator and the power source 1. When the power source voltage varies, both of the input control signal and the voltage of the emitter power source 24 vary, and the voltage at the node 14 as the input signal to the comparator 16 varies similarly to the power source voltage. On the other hand, the voltage at the node 19 as the input signal on the reference circuit side to the comparator 16 is different in variation amount from the power source voltage since one end of the resistor 18 is connected to the earth 2. For this reason, the timing at which the sampling signal is outputted when the power source voltage varies is changed. A quantity of change of the timing can be adjusted by changing the division ratio between the resistors 17 and 18 of the reference circuit and the value of the Zener diode 35. Thus, if the adjustment is carried out in such a way that the timing at which the sampling signal is outputted is changed to the same degree as that of the variation in a period of time from OFF time of the input control signal up to a time point when the gate voltage is decreased when the power source voltage varies, then even when the power source voltage varies, it is possible to make constant a period of time from the reduction of the gate voltage up to the output of the sampling signal.

If in FIG. 17, the values of the Zener diode 35, and the resistors 17 and 18 are adjusted (or the position of the Zener diode 35 is changed to the position between the resistor 18 and the earth 2 as the case may be), then a period of time from a time point when the gate voltage begins to be decreased up to a time point when it is detected can also be set so as to vary with respect to the variation of the power source voltage. When the power source voltage is decreased, even if the current value is fixed, the gate voltage during the Miller period of time is decreased. For this reason, a period of time required for the gate voltage to reach the fixed Miller period of time is prolonged due to the influence of the inductance of the gate line, and the like. Then, if the setting is made in such a way that when the power source voltage is decreased, a period of time required for the detection is delayed, then it is possible to prevent the drive circuit from undergoing the malfunction due to these influences. In addition, since when the power source voltage is decreased, the difference between the voltage at the emitter and the earth voltage is reduced, the Miller period of time is prolonged. For this reason, even if the period of time required for the detection is delayed to the degree in which that period of time falls within the range of the Miller period of time in reduction of the power source voltage, no detection is delayed.

As described above, according to this embodiment, since the sampling signal generating circuit 7 is configured in such a way that the period of time for the output thereof is independent of the power source voltage for the drive circuit and that the sampling signal is outputted within a fixed period of time from a time point when the gate voltage begins to be decreased in accordance with the OFF command of the input control signal, it is possible to prevent the drive circuit from undergoing the malfunction due to the variation of the monitoring period of time.

In addition, since that circuit is configured in such a way that the period of time for the output of the sampling signal generating circuit 7 depends on the power source voltage, and the period of time for the output is delayed as the power source voltage is further decreased, it is possible to prevent the drive circuit from undergoing the malfunction even when a period of time required for the gate voltage to reach the Miller period of time during the reduction of the power source voltage is prolonged.

Eleventh Embodiment

While in the above-mentioned first to tenth embodiments, the period of time for detection of the gate voltage is set using the input control signal, it can also be set directly from the gate voltage.

Figure 18:
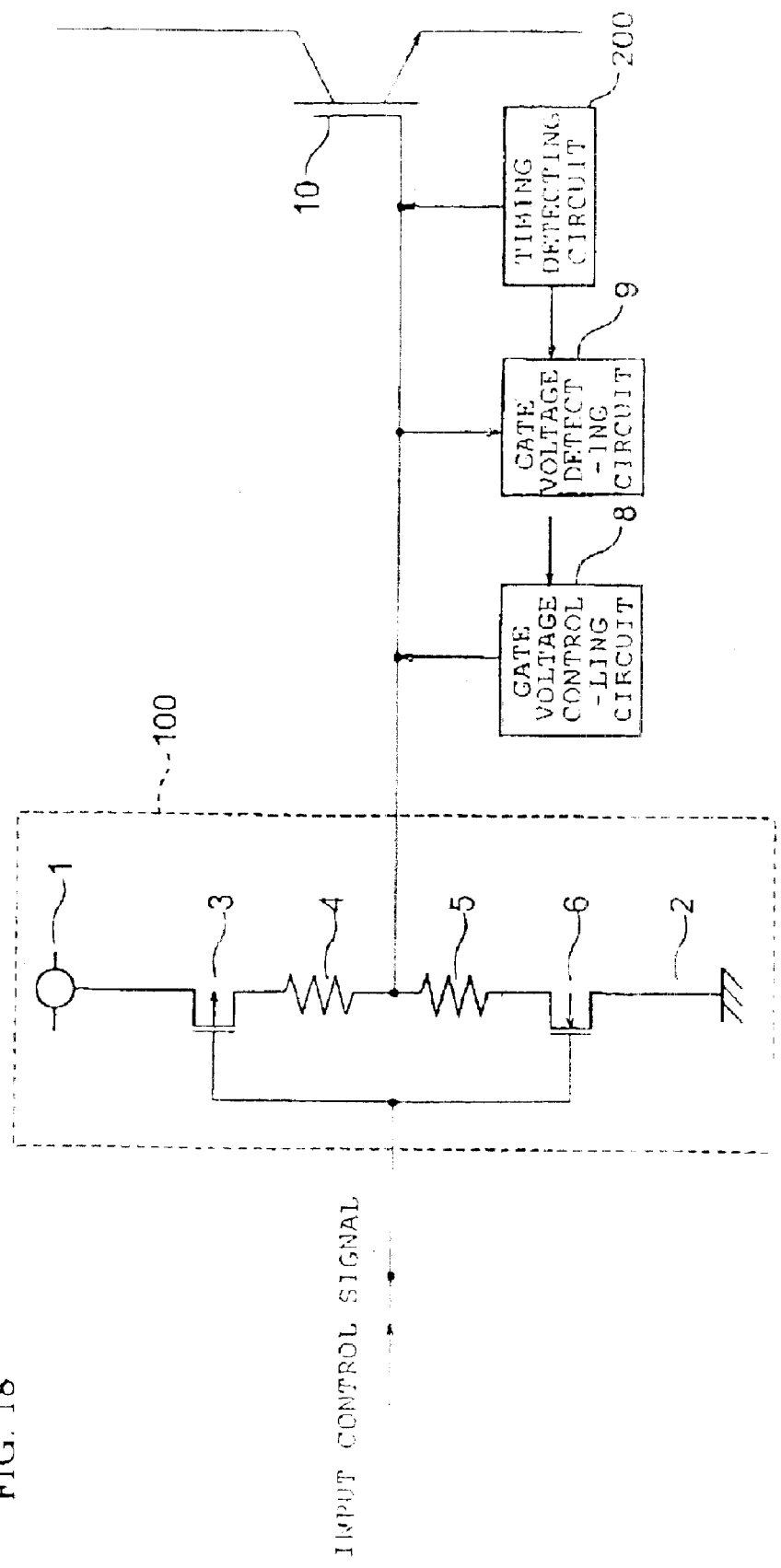
FIG. 18 is a circuit diagram showing a configuration of a drive circuit for a power semiconductor device according to an eleventh embodiment of the present invention.

FIG. 18 is a circuit diagram showing a configuration of the drive circuit for a power semiconductor device according to an eleventh embodiment of the present invention. In the eleventh embodiment, the sampling signal generating circuit 7 shown in the above-mentioned first to tenth embodiment is removed, and instead thereof, a timing detecting circuit 200 is newly provided. Since other constituent elements are the same in configuration as those of FIG. 1, the description thereof is omitted here for the sake of simplicity.

The timing detecting circuit 200 is the circuit for outputting a signal at the time when the time has entered into the Miller period of time. Thus, upon entrance into the Miller period of time, it is possible to operate the gate voltage detecting circuit and also it is possible to further shorten the delay time from the input of the input control signal up to turn-OFF of the drive circuit. In addition, since in the eleventh embodiment, the timing can be generated directly from the gate voltage, the circuit for generating the input control signal is burdened with no excessive load.

Figure 19:
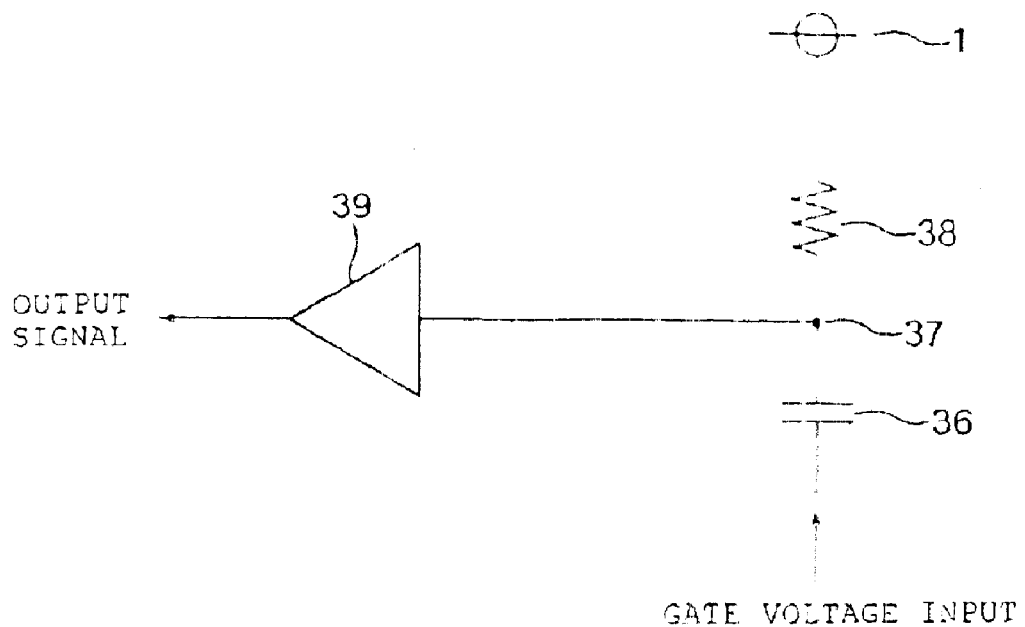
FIG. 19 is a circuit digram showing a configuration of a timing detecting circuit according to the eleventh embodiment of the present invention.

FIG. 19 shows a specific circuit example of the timing detecting circuit 200 according to the eleventh embodiment of the present invention. In FIG. 19, reference numeral 1 designates a power source, reference numeral 36 designates a capacitor, reference numeral 37 designates a node, reference numeral 38 designates a resistor, and reference numeral 39 designates a buffer. As shown in FIG. 19, the capacitor 36 is connected to a gate line, and the resistor 38 is connected between the capacitor 36 and the power source 1. The buffer 39, as shown in the figure, is connected to the node 37 provided between the resistor 38 and the capacitor 36 so that an output signal outputted from the buffer 39 is inputted to the gate voltage detecting circuit 9.

The capacitor 36 and the resistor 38 constitute a high-pass filter. Then, only when the gate potential is abruptly changed, a pulse is generated at the node 37. Consequently, this circuit can accurately detect the Miller period of time by adjusting the capacitance value of the capacitor 36 and the resistance value of the resistor 3.

From the foregoing, the timing detecting circuit 200 of this embodiment can output the signal at the time when the time enters into the Miller period of time.

As described, in this embodiment, the timing detecting circuit 200 is provided in order to detect directly a time point at which the time enters into the Miller period of time from the gate voltage. Thus, upon entrance of time into the Miller period of time, it is possible to operate the gate voltage detecting circuit 9, it is possible to further shorten the delay time from the input of the input control signal up to turn-OFF, and also it is possible to prevent the circuit for generating the input control signal from being burdened with an excessive load.

As described above, according to this embodiment, the timing detecting circuit 200, the gate voltage detecting circuit 9 and the gate voltage controlling circuit 8 are provided. Since the over-current detection level can be changed by adjusting the Miller voltage detection level, even in the case where the current is not the large current as in the prior art, but is the small current, it is possible to detect an over-current and hence it is possible to carry out the over-current protection for suppressing generation of a surge voltage. In addition, upon entrance of the time into the Miller period of time, it is possible to operate the gate voltage detecting circuit and hence it is possible to further shorten the delay time from the input of the input control signal up to the turn-OFF. Moreover, since the timing can be generated directly from the gate voltage, the circuit for generating the input control signal is burdened with no excessive load.

Furthermore, since the timing detecting circuit 200, as shown in FIG. 19, is constituted by the delay circuit having the resistor 8 and the capacitor 36, and the buffer 39, it is possible to reduce the cost thereof. In addition, the delay time can be arbitrarily adjusted by changing either the resistance value of the resistor 38 or the capacitance value of the capacitor 36.

Twelfth Embodiment

Figure 20:
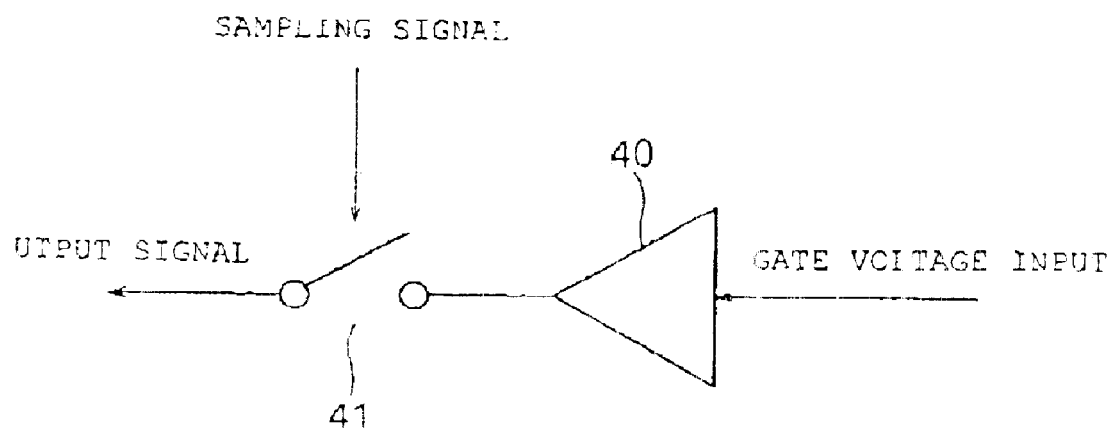
FIG. 20 is a circuit diagram showing a configuration of a gate voltage detecting circuit according to a twelfth embodiment of the present invention.

The gate voltage detecting circuit 9 is the circuit for measuring the gate voltage of the IGBT 10. The gate voltage is changed in an analog manner from the potential of the earth 2 to the potential of the power source 1. FIG. 20 shows an example of the gate voltage detecting circuit 9 according to a twelfth embodiment. In FIG. 20, reference numeral 40 designates a voltage amplifier which is connected to a gate line of the IGBT 10, and reference numeral 41 designates a switch which is switched on the basis of the sampling signal outputted either from the sampling signal generating circuit 7 or from the timing detecting circuit 200. In this example, the gate voltage is changed and amplified to an arbitrary level by the voltage amplifier 40. Whether or not the output signal from the voltage amplifier 40 is outputted is determined by the operation of the switch 41 which is controlled with the sampling signal outputted either by the sampling signal generating circuit or by the timing detecting circuit 200. In this example, since the value of the gate voltage is detected to be outputted in the form of the analog value, this embodiment can be applied to the variable control.

As described above, according to this embodiment, the gate voltage detecting circuit 9 includes the voltage amplifier 40 which is connected to the gate line of the power semiconductor device and which serves to amplify the gate voltage to a predetermined level, and the switch 41 which is connected to the voltage amplifier 40 and switched on the basis of the signal outputted from the timing detecting circuit 200. Also the detected information is outputted in the form of an analog value. Consequently, this embodiment can be applied to the variable control.

Thirteenth Embodiment

Figure 21:
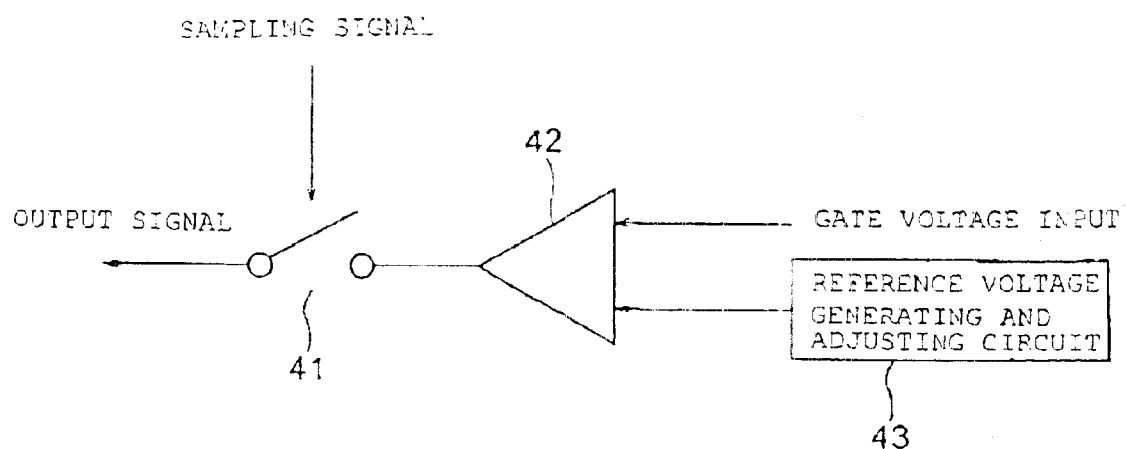
FIG. 21 is a circuit diagram showing a configuration of a gate voltage detecting circuit according to a thirteenth embodiment of the present invention.

FIG. 21 shows an example of the gate voltage detecting circuit 9 as a thirteenth embodiment. In FIG. 21, reference numeral 41 designates a switch the state of which is switched on the basis of the sampling signal outputted either from the sampling signal generating circuit 7 or from the timing detecting circuit 200, reference numeral 42 designates a voltage comparator which is connected to the gate line of the IGBT 10 and which serves to detect whether the level of the gate voltage is LOW or HIGH with respect to the reference voltage outputted from a reference voltage generating and adjusting circuit as will be described below, and reference numeral 43 designates the reference voltage generating and adjusting circuit 43 for outputting a predetermined reference voltage which is previously set. In this example, the voltage comparator 42 judges whether or not the gate voltage is larger than the reference voltage outputted by the reference voltage generating and adjusting circuit 43 to output a binary signal either at a LOW level or at a HIGH level. Whether or not the output signal from the voltage comparator 42 is outputted is determined by the operation of the switch 41 which is controlled on the basis of the sampling signal generated either from the sampling signal generating circuit 7 or from the timing detecting circuit 200.

As described above, since the Miller voltage is uniquely determined on the basis of the current value, if the reference voltage is set to the value of a predetermined Miller voltage, then when the current having the level higher than such a predetermined level is caused to flow, it is possible to switch the output signal of the voltage comparator 42.

While since in this example, the value of the gate voltage is detected to be outputted in the form of the digital value, this embodiment cannot be applied to the variable control, it is possible to configure the circuit which has the high noise resistance and which hardly undergoes the malfunction.

Fourteenth Embodiment

Figure 22:
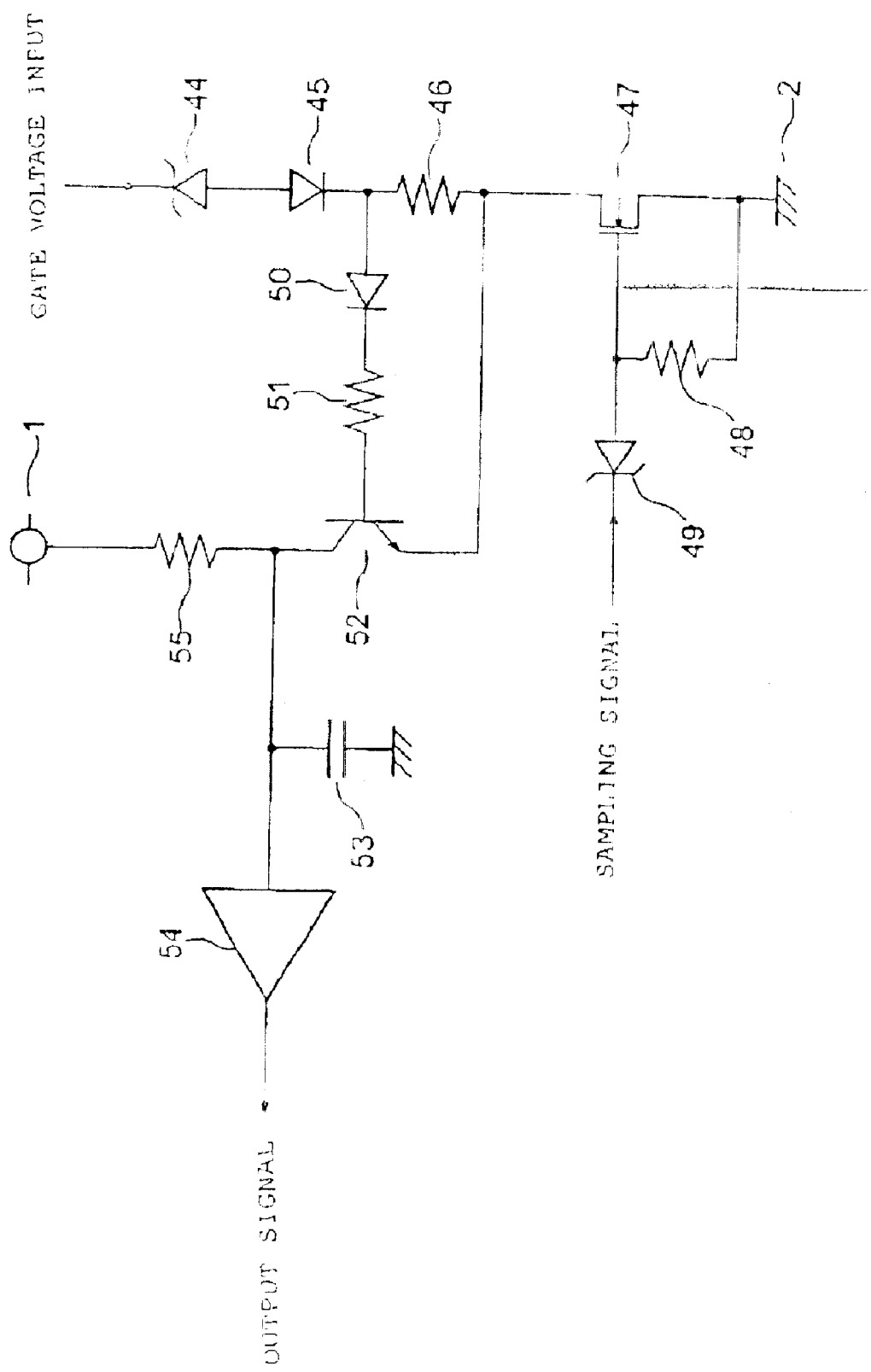
FIG. 22 is a circuit diagram showing a configuration of a gate voltage detecting circuit according to a fourteenth embodiment of the present invention.

FIG. 22 shows an example of the gate voltage detecting circuit 9 as a fourteenth embodiment. In FIG. 22, reference numeral 1 designates a power source; reference numeral 2, the earth; reference numerals 44 and 49, Zener diodes; reference numerals 45 and 50, diodes; reference numerals 46, 48, 51 and 55, resistors; reference numeral 47, a MOS transistor; reference numeral 52, a bipolar transistor; reference numeral 53, a capacitor; and reference numeral 54, a buffer.

The Zener diode 49, the resistor 48 and the MOS transistor 47 constitute the circuit for determining whether or not the detection circuit is made operated. As shown in the figure, one end of the Zener diode 49 is connected to the sampling signal generating circuit 7 or the timing detecting circuit 200, and the MOS transistor 47 is connected to the other end of the Zener diode 49. The resistor 48 is connected between the node provided between the Zener diode 49 and the MOS transistor 47, and the earth 2. At the time when the voltage larger than the sum of the breakdown voltage of the Zener diode 49 and the threshold voltage of the MOS transistor 47 has been inputted in the form of the sampling signal, the detection circuit is turned ON. Now, the provision of the Zener diode 49 makes it possible to control the voltage at which the circuit is turned ON. In addition, the resistor 48 is provided in order to discharge therethrough the electric charges accumulated in the capacity between the Zener diode 49 and the MOS transistor 47. Consequently, in the case where no Zener diode is used, these constituent elements may be removed.

The resistor 55, the capacitor 53 and the buffer 54 constitute the circuit for outputting the detected signal. As shown in the figure, the buffer 54 is connected to the gate voltage controlling circuit 8, and the resistor 55 is connected between the buffer 54 and the power source 1. The capacitor 53 is connected between the node provided between the buffer 54 and the resistor 55, and the earth. Now, since the voltage developed across the capacitor 53 is coupled to the power source 1 through the resistor 55, its level is normally HIGH. Now, the buffer 54, in response to the signal from the capacitor, carries out either the current amplification or the voltage amplification. Consequently, while in the case where an inverter is used instead of the buffer 54, the logic is inserted, since the circuit has to be configured on the basis of such a logic structure from the beginning, there is no problem.

The Zener diode 44, the diodes 45 and 50, the resistors 46 and 51, and the bipolar transistor 52 constitute the circuit for detecting the gate voltage. As shown in the figure, one end of the Zener diode 44 is connected to the gate line of the IGBT 10, one end of the diode 45 is connected to the other end of the Zener diode 44, and the resistor 46 is connected to the other end of the diode 45. The above-mentioned MOS transistor 47 is connected to the resistor 46. Also, the diode 50, the resistor 51, and the bipolar transistor 52 are connected in the order from the diode 45 side between the node provided between the diode 45 and the resistor 46, and the node provided between the above-mentioned buffer 54 and the resistor 55.

The operation of the gate voltage detecting circuit 9 according to this embodiment will hereinbelow be described. First of all, when the MOS transistor 47 is in the OFF state, no voltage is developed across the opposite terminals of the resistor 46, Thus, since the bipolar transistor 52 is not turned ON, no electric charges accumulated in the capacitor 53 are discharged, and a HIGH level is held. Thus, the output signal is at a HIGH level.

On the other hand, it is assumed that in response to the sampling signal, the MOS transistor 47 is turned ON. Then, when the ON resistance of the MOS transistor 47 is enough low, the potential at the one terminal of the resistor 46 may be regarded as the earth potential. This leads to that the voltage which is obtained by subtracting the breakdown voltage or the Zener diode 44 and the ON voltage of the forward direction of the diode 45 from the gate voltage is applied across the resistor 46.

Thus, when the gate voltage is enough large the voltage applied across the resistor 46 becomes enough large to turn ON the bipolar transistor 52. Consequently, since the electric charges accumulated in the capacitor 53 are discharged to the earth through the bipolar transistor 52, the level of the output signal goes LOW.

Conversely, when the gate voltage is enough low, no voltage is developed across the resistor. Consequently, since the bipolar transistor 52 is held in the OFF state, no electric charges accumulated in the capacitor 53 are discharged, and hence the output signal is held at a HIGH level.

That is to say, the breakdown voltage of the Zener diode 44 is selected in such a way that the voltage is developed across the resistor 46 in the Miller voltage in a target current value to be judged as an over-current. In addition, the sampling signal generating circuit 7 or the timing detecting circuit 200 is adjusted in such a way that the gate voltage during the Miller period of time, i.e., the Miller voltage can be detected. In this example, it can be, as a result, judged whether or not the current of interest is an over-current.

By the way, while with respect to the bipolar transistor 52 which has been turned ON, its collector current value is changed depending on the magnitude of the bias current, this change can be made on the basis of the adjustment of the resistors 51 and 46.

In addition, while the diode 50 is provided in order to prevent the current from being caused to flow in the reverse direction, it may be removed.

Moreover, the diode 45 is provided in order to correct the temperature characteristics of the Zener diode 44, and hence when there is no change in temperature, it may not be used.

Also, since the buffer 54 is inserted in order to make easy the driving ability and the logic synthesis, it may be removed.

Fifteenth Embodiment

Figure 23:
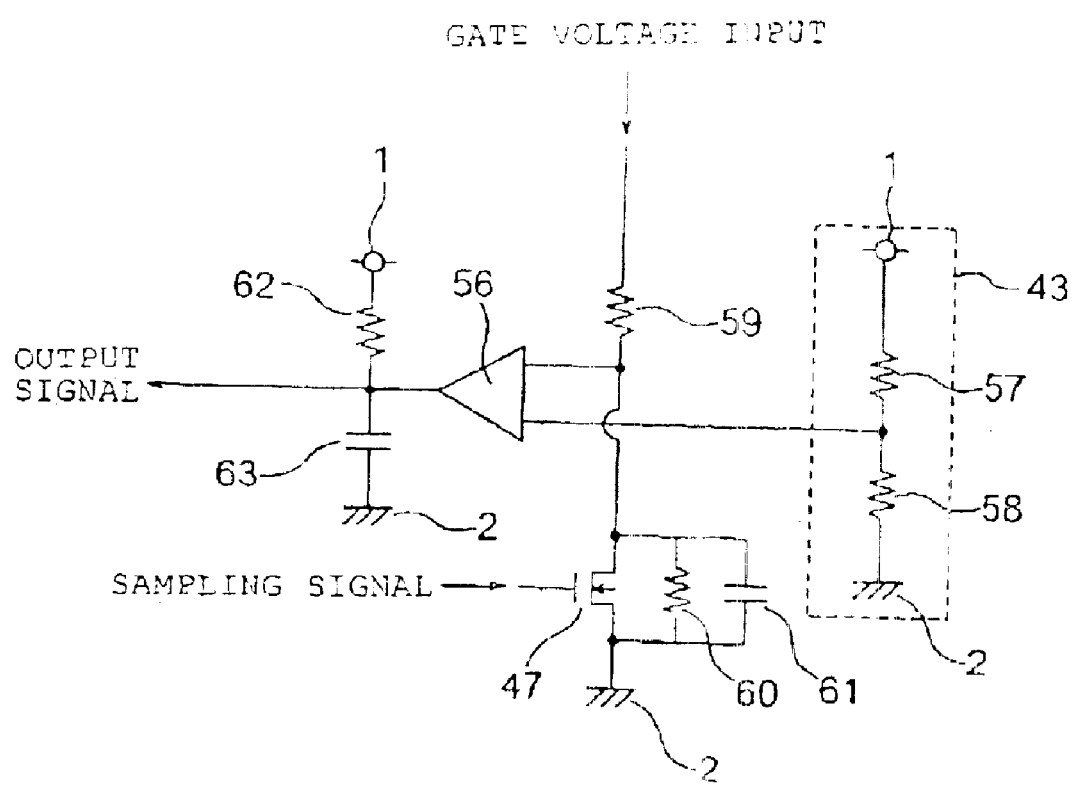
FIG. 23 is a circuit diagram showing a configuration of a gate voltage detecting circuit according to a fifteenth embodiment of the present invention.

FIG. 23 shows a specific circuit example of the gate voltage detecting circuit 9 employing a comparator as the voltage comparator 42 as shown in a thirteenth embodiment.

In the figure, reference numeral 56 designates a comparator for comparing the divided voltage value of the gate voltage and the input signal from the reference voltage generating and adjusting circuit 43 with each other to output the comparison result; reference numerals 57 and 58, resistors constituting the reference voltage generating and adjusting circuit 43 and serving to divide the voltage of the power source 1; reference numerals 59 and 60, resistors for dividing the gate voltage; reference numeral 47, a MOS transistor which is connected in parallel with the resistor 60 and which operates on the basis of the sampling signal either from the sampling signal generating circuit 7 or from the timing detecting circuit 200; reference numeral 61, a capacitor acting as a filter; reference numeral 62, a resistor connected between the power source 1 and an output terminal of the comparator 56; and reference numeral 63, a capacitor acting as a filter.

In the normally ON state, an ON command is input either from the sampling signal generating circuit 7 or from the timing detecting circuit 200 to the MOS transistor 47 so that the resistor 60 is short-circuited. While in this embodiment, the sampling signal is directly inputted to the MOS transistor 47, as shown in the fourteenth embodiment, both of the Zener diode 49 and the resistor 48 may also be used therefor. Since the resistor 60 is short-circuited the potential of the input, on the gate voltage side, to the comparator 56 goes roughly the earth potential and hence is lower than the voltage inputted from the reference voltage generating and adjusting circuit 43, it is not detected. During the Miller period of time in the OFF operation, an OFF command is issued either from the sampling signal generating circuit 7 or from the timing detecting circuit 200 to the MOS transistor 47, thereby turning OFF the MOS transistor 47. This allows the value which is obtained by dividing the gate voltage through the resistors 59 and 60 to be inputted to the comparator 56. When that value is higher in level than the input voltage from the reference voltage generating and adjusting circuit 43, the comparator 56 operates to output a detection signal. The output terminal of the comparator 56 is connected to the power source 1 through the resistor 62, and hence the operation of the comparator 56 allows the output signal either at a HIGH level or at a LOW level to be outputted. Then, the setting can be made depending on the connection style on the input side of the comparator 56 in such a way that the signal at a LOW level is outputted during the flow of an over-current and the signal at a HIGH level is outputted during the normal operation, or the signal at a HIGH level is outputted during the flow of an over-current and the signal at a LOW level is outputted during the normal operation. Thus, the setting is determined on the basis of the state of the gate voltage setting circuit for receiving as its input the output signal.

Consequently, if the configuration as in this embodiment is adopted, when in the Miller voltage in a target current value to be judged as an over-current, the resistors 57 to 60 are adjusted in such a way that the input voltage obtained by dividing the gate voltage to the comparator 56 becomes higher in level than, the input voltage from the reference voltage generating and adjusting circuit 43, it is possible to judge whether or not the current of interest is an over-current to output an output signal.

As described above, according to this embodiment, the gate voltage detecting circuit 9 includes the reference voltage generating and adjusting circuit 43 for outputting a predetermined reference voltage which is previously set, the comparator 56 which is connected to the gate line of the power semiconductor device and which serves to detect whether the gate voltage of the power semiconductor device is larger or smaller than the reference voltage, and the switch 47 which is connected to the comparator 56 and the state of which is switched on the basis of the signal-outputted from the sampling signal generating circuit 7 or the timing detecting circuit 200. That is to say, since the gate voltage detecting circuit 9 is constituted by the comparator, the circuit for generating the reference voltage, and the switch the state of which is switched on the basis of the signal generated by the sampling signal generating circuit and the detected information is outputted in the form of a digital value, it is possible to configure the circuit which has the high noise resistance and which hardly undergoes the malfunction.

Sixteenth Embodiment

Figure 24:
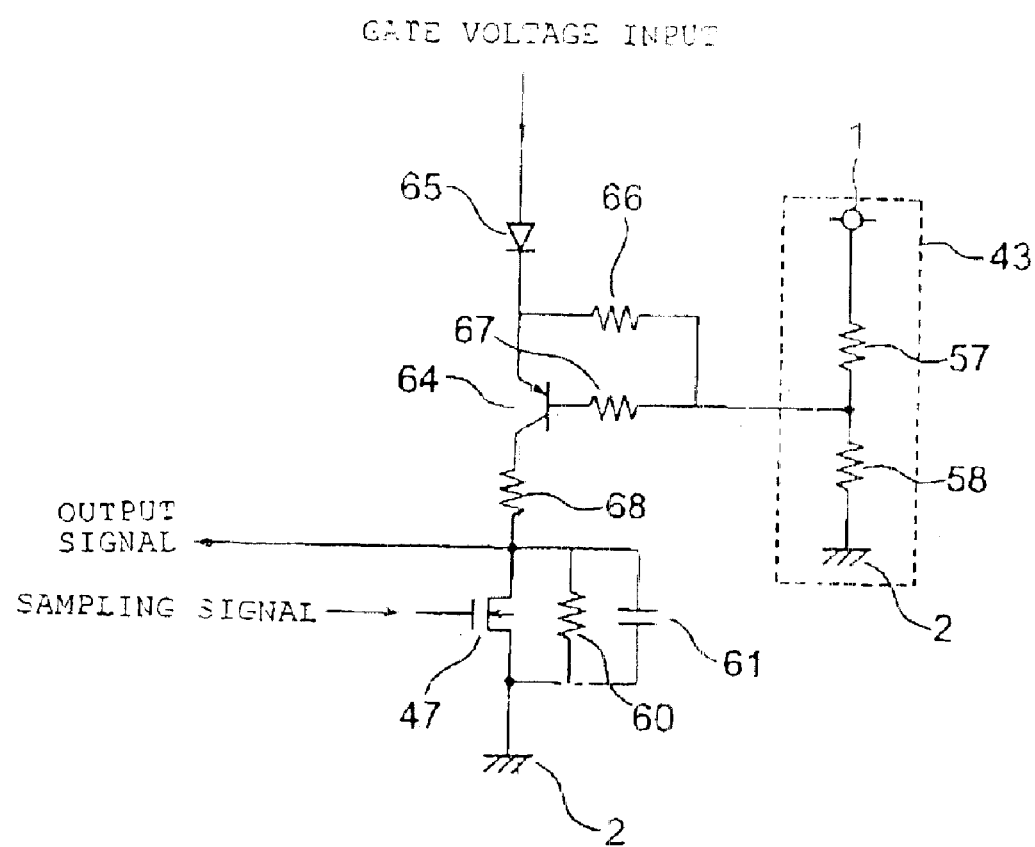
FIG. 24 is a circuit diagram showing a configuration of a gate voltage detecting circuit according to a sixteenth embodiment of the present invention.

FIG. 24 shows a specific circuit example of the gate voltage detecting circuit 9 according to an embodiment different from the fifteenth embodiment. In this embodiment, a bipolar transistor 64 is used as the voltage comparator 42 shown in the thirteenth embodiment to compare the gate voltage with the reference voltage from the reference voltage generating and adjusting circuit 43. In the figure, reference numeral 64 designates a bipolar transistor; reference numeral 65, a diode for preventing the counter-flow of a current; reference numeral 66, a resistor connected between an output terminal of the reference voltage generating and adjusting circuit 43 and an emitter of the bipolar transistor 64; reference numeral 67, a resistor connected between an output terminal of the reference voltage generating and adjusting circuit 43 and a base of the bipolar transistor 64; and reference numeral 68, a resistor having one end connected to the bipolar transistor and the other end connected to the MOS transistor 47, the resistor 60 and the capacitor 61. Since the other constituent elements are the same in configuration as those shown in FIG. 23, the description thereof is omitted here for the sake of simplicity.

In the normally ON state, an ON command is input either from the sampling signal generating circuit 7 or from the timing detecting circuit 200 to the MOS transistor 41, and hence the potential of the output signal becomes roughly the earth potential. During the Miller period of time in the OFF stare, an OFF command is input to the MOS transistor 47 to turn OFF the MOS transistor 47. When the gate voltage during the Miller period of time is higher in level than the voltage of the reference voltage generating and adjusting circuit 43, a current is caused to flow through the resistor 66 and hence the voltage is developed across the base and the emitter of the bipolar transistor 64, which causes the bipolar transistor 64 to become a conduction state Since the current is caused to flow through the resistors 68 and 60, the voltage is developed across the resistor 60 to output this voltage as an output signal.

Consequently, even if the circuit is configured as in this embodiment, when in the Miller voltage in a target current value to be judged as an over-current, the resistance values of the resistors 57 and 58 are adjusted in such a way that the input voltage to the gate becomes higher in level than the output voltage from the reference voltage generating and adjusting circuit 43, it is possible to judge whether or not the current of interest is an over-current and also it is possible to output an output signal.

Seventeenth Embodiment

Figure 25:
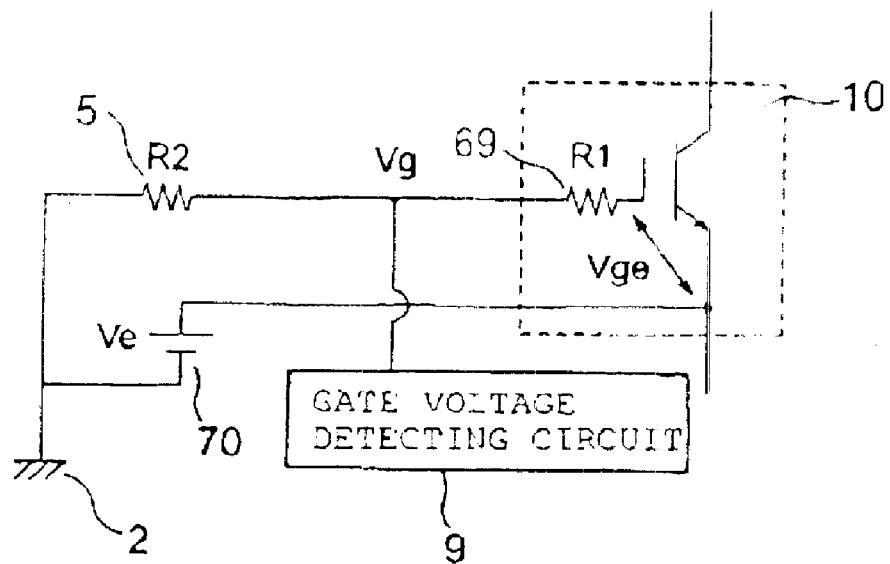
FIG. 25 is a circuit diagram showing a configuration of a simplified circuit configuration for turning OFF an IGBT.

In the case where the gate voltage detecting circuit as shown in the above-mentioned fourteenth to sixteenth embodiments is used, when the power source voltage used to drive the IGBT 10 varies, the gate voltage varies and also the current level at which an over-current is detected varies in some cases. FIG. 25 shows a simplified circuit configuration when turning OFF the IGBT 10. A balance resistor 69 is included in the inside of the IGBT 10 in some cases. In addition, an emitter power source 70 is used for the emitter of the IGBT 10 in addition to the power source for driving the gate in some cases. In the figure, there are shown such cases. The gate voltage Vg is outputted to the gate voltage detecting circuit 8 from the viewpoint of the earth potential during the Miller period of time, and from the viewpoint of the earth potential, is expressed by Expression 1 below using the emitter voltage Ve, the gate-emitter voltage Vgem, during the Miller period of time in the OFF state, determined by the current, the balance resistance R1 and the gate resistance R2 in the OFF state:

$$Vg=(Ve+Vgem)R2/(R1+R2) \quad \text{(Expression 1)}.$$

While Vgem depends on the current and hence is not changed by the power source voltage, when the voltage Ve of the emitter power source 70 is changed due to the power source voltage variation, the gate voltage Vg is changed accordingly. For this reason, the current level at which an over-current is detected is changed.

Thus, in the case where the reference voltage generating and adjusting circuit 43 is used as shown in the fifteenth and sixteenth embodiment, if the reference voltage generating and adjusting circuit 43 is used in which the output voltage varies in correspondence to the variation of the gate voltage due to the variation of the power source voltage even if the current in this case is the same as that in the former case, then even when the power source voltage varies, it is possible to detect an over-current with the same current value.

Figure 26:
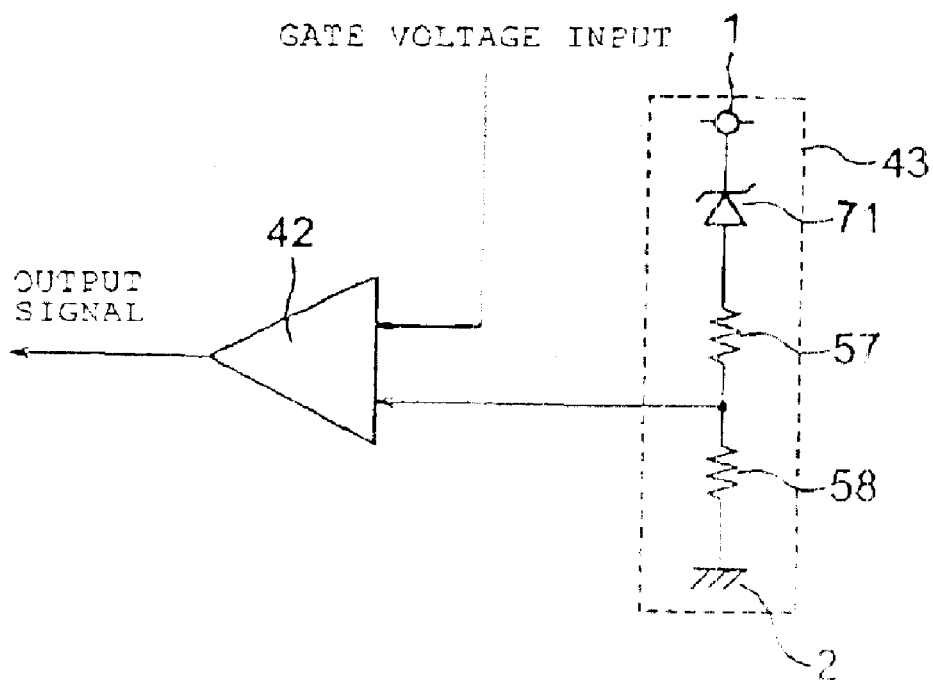
FIG. 26 is a circuit diagram showing a configuration of a gate voltage detecting circuit according to a seventeenth embodiment of the present invention.

FIG. 26 shows a drive circuit for a power semiconductor device according to a seventeenth embodiment of the present invention. In the figure, there is shown a specific configuration of the over-current detecting circuit. In addition to the reference voltage generating and adjusting circuit 43 shown in the fifteenth and sixteenth embodiments, a Zener diode 71 is provided between the power source 1 and the resistor 57 of the reference voltage generating and adjusting circuit 43. In Expression 1, in general, the emitter voltage Ve is given by Ve=Vcc−Vge where Vcc is the power source voltage and Vge is the gate-emitter voltage in the normal state. Thus, Expression 1 is transformed into Expression 2:

$$Vg=(Vcc-(Vge-Vgem))R2/(R1+R2) \quad \text{(Expression 2)}.$$

From Expression 2, if the voltage of the Zener diode 71 is set to (Vge−Vgem), and the resistance ratio between the resistance values of the resistors 57 and 58 of the reference voltage generating and adjusting circuit 43 is set to the same degree as that of the resistance ratio between the resistance value of the balance resistor 69 and the resistance value of the gate resistor 5 in the OFF state, then it is possible to obtain the voltage of the reference voltage generating and adjusting circuit 43 which is identical to the gate voltage in the current value which is wanted to be set. Then, those are compared with each other in a voltage comparator, thereby being able to detect an over-current with a constant current even when the power source voltage varies. For this reason, even when the power source voltage varies, it is possible to prevent the malfunction such that an over-current is not detected with the current value at which the over-current is wanted to be detected, or an over-current is detected with the value smaller than the current value at which the over-current is wanted to be detected. In the case where the gate voltage, as shown in the fifteenth embodiment, is further divided to carry out the comparison, the resistance value of a resistor of the reference voltage generating and adjusting circuit has to be set in Expression 2 in such a way that the division ratio is established which is the same as the value which is obtained through the division process using the division ratio.

As described above, according to this embodiment, even when the above-mentioned Miller voltage varies due to the variation of the power source voltage of the drive circuit, the detection level for an over-current is not changed, and when a current having a level equal to or larger than the fixed value is caused to flow, the gate voltage detecting circuit outputs the over-current detection signal. Consequently, even when the power source voltage varies, it is possible to prevent the malfunction such that an over-current is not detected with the current value at which the over-current is wanted to be detected, or an over-current is detected with the value smaller than the current value at which the over-current is wanted to be detected.

Eighteenth Embodiment

Figure 27:
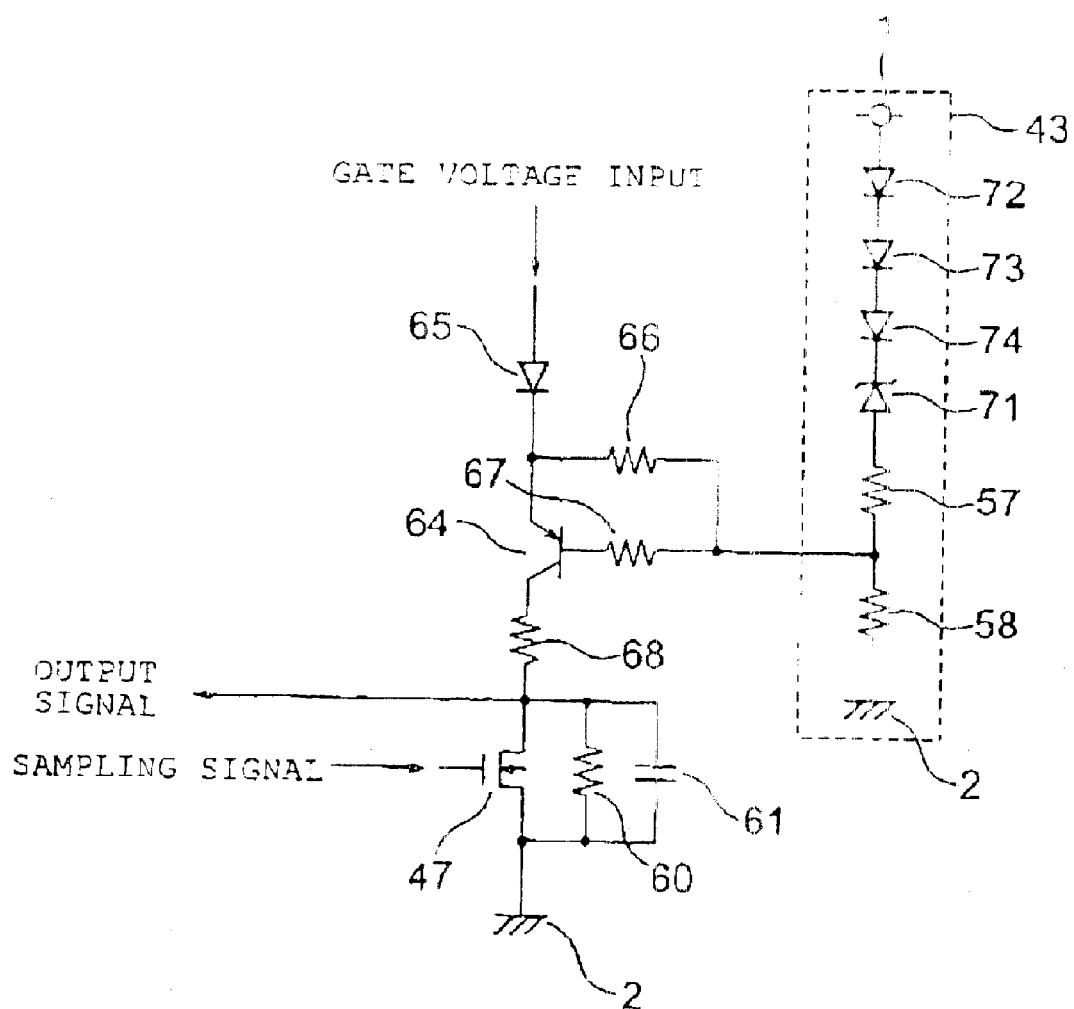
FIG. 27 is a circuit diagram showing a configuration of a gate voltage detecting circuit according to an eighteenth embodiment of the present invention.

FIG. 21 shows a specific example of an over-current detecting circuit in the drive circuit for a power semiconductor device as an eighteenth embodiment. While in the fourteenth embodiment as well, the description was given with respect to the temperature correction using the diode, in this embodiment, a more specific system is shown with the circuit shown in the sixteenth embodiment as an example. In FIG. 27, in addition to the configuration of the above-mentioned sixteenth embodiment (refer to FIG. 24), a Zener diode 71, and diodes 74, 73 and 72 are provided in this order between the resistor 57 and the power source 1 in the reference voltage generating and adjusting circuit 43. Other constituent elements are the same in configuration as those shown in FIG. 24. The Zener diode 71 is provided in order to prevent the malfunction, when the power source voltage varies as described in the seventeenth embodiment. In general, an ON voltage of an element such as a Zener diode, a diode, or a bipolar transistor changes depending on the temperatures. Thus, in the case where the over-current detecting circuit is configured using those elements, there is the possibility that the current level at which an over-current is detected is changed. For this reason, in the case where an element having the reverse temperature characteristics is used, or a voltage comparator 42 is used, it is possible to correct the change in over-current detection level due to the temperatures by providing elements having the same temperature characteristics on the input side of the gate voltage and in the reference voltage generating and adjusting circuit 43, or so forth. In the circuit shown in FIG. 27, a diode 65 is used for the input from the gate voltage. Thus, the provision of the diode 72 in the reference voltage generating and adjusting circuit 43 makes it possible to cancel the changes in characteristics due to the temperatures. In addition, since the bipolar transistor 64 is used, the provision of the diode 73 having the temperature characteristics similar to those of the bipolar transistor 64 in the reference voltage generating and adjusting circuit 43 makes it possible to cancel the changes in characteristics due to the temperatures. In addition, the voltage variation of the Zener diode 71 used in the reference voltage generating and adjusting circuit 43 changes due to the temperatures depending on the used voltage With respect to the voltage variation due to the temperatures, when the temperature rises, sometimes the voltage is decreased and otherwise is increased. Then, when the voltage is increased, as shown in FIG. 27, the diode 74 in which the voltage developed across it is decreased due to temperature rising has to be provided in the reference voltage generating and adjusting circuit 43. Conversely, when the voltage is decreased, a diode having the similar temperature characteristics has to be provided in series with the diode 65 on the gate voltage input side. One diode may be provided therefor, or a plurality of diodes may be provided therefor in order to obtain the same degree of the temperature characteristics.

While in this embodiment, one diode is used for one element for the convenience of description, this is not necessarily required. That is to say, the same temperature characteristics have to be obtained as a whole. In addition, when a diode is used, since the voltage inputted to the bipolar transistor 64 is changed by an ON voltage, it is necessary to adjust the Zener diode 71. In addition, while in this embodiment, the description has been given with respect to the case where the bipolar transistor 64 is used, it is possible to carry cut similarly the correction for the temperatures in other systems as well.

Even when the temperature is changed due to the correction for the temperatures in such a manner, it is possible to prevent the malfunction such that an over-current is not detected with the current-value at which the over-current is wanted to be detected, or an over-current is detected with the value smaller than the current value at which the over-current is wanted to be detected.

Also, even when the above-mentioned Miller voltage varies due to the variation of the power source voltage of the drive circuit, the detection level for an over-current is not changed and when a current having the magnitude equal to or larger than a fixed value is caused to flow, the gate voltage detecting circuit outputs the over-current detection signal. Thus, even when the power source voltage varies, it is possible to prevent the malfunction such that an over-current is not detected with the current value at which the over-current is wanted to be detected, or an over-current is detected with the value smaller than the current value at which the over-current is wanted to be detected.

Moreover, even when the temperature of the drive circuit varies, the detection level for an over-current is not changed and when a current having the magnitude equal to or larger than a fixed value is caused to flow, the above-mentioned gate voltage detecting circuit outputs the over-current detection signal. Thus, even when the temperature is changed, it is possible to prevent the malfunction such that an over-current is not detected with the current value at which the over-current is wanted to be detected, or an over-current is detected with the value smaller than the current value at which the over-current is wanted to be detected.

Nineteenth Embodiment

Figure 28:
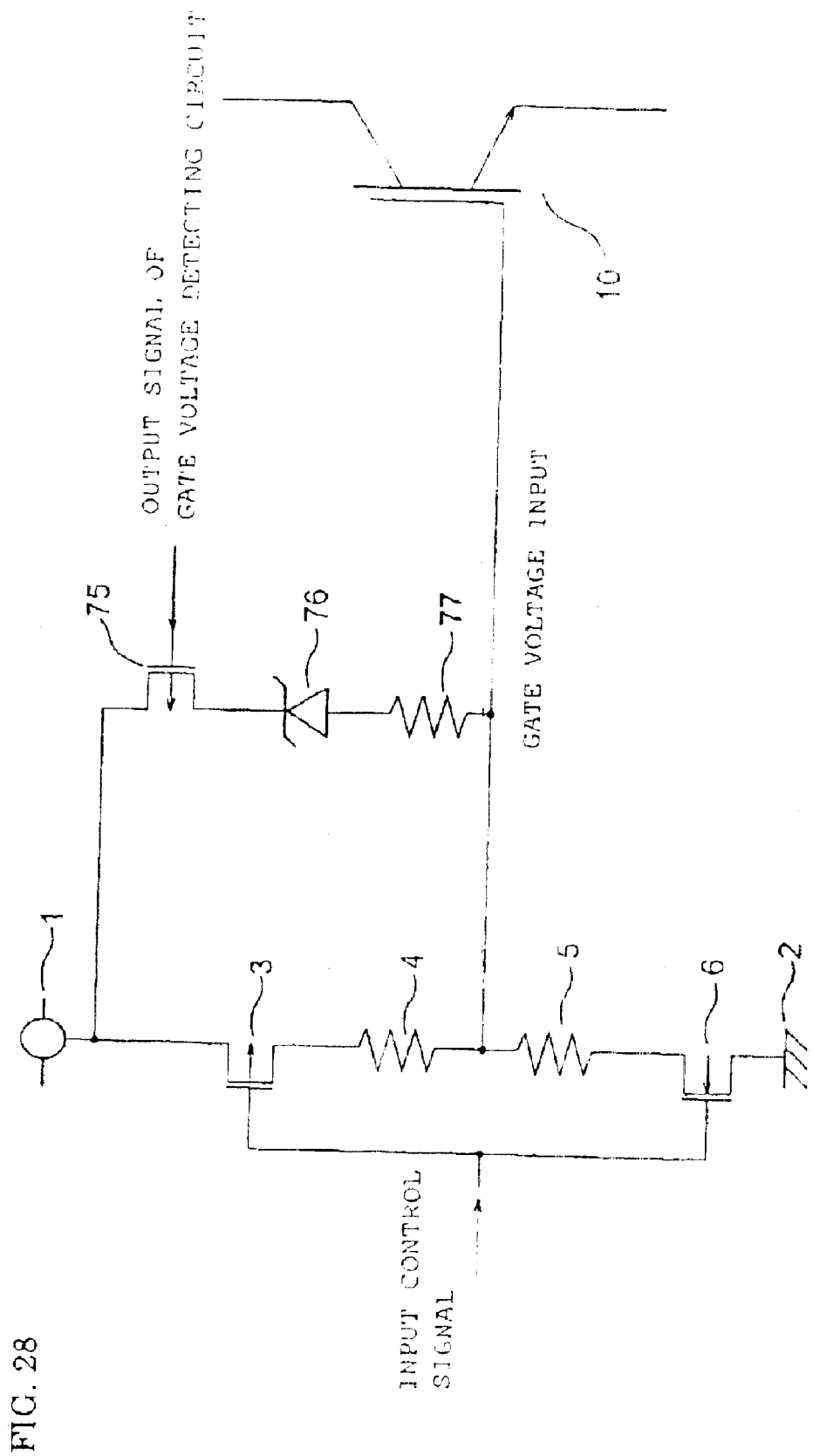
FIG. 28 is a circuit diagram showing a configuration of a gate voltage controlling circuit according to a nineteenth embodiment of the present invention.

The gate voltage controlling circuit is the circuit for adjusting the gate voltage when cutting off a current. FIG. 28 is a circuit diagram showing a specific example of the gate voltage controlling circuit 8 shown in the first and eleventh embodiments. In FIG. 28, reference numeral 1 designates a power source reference numeral 2, the earth; reference numeral 3, a P-channel MOSFET; reference numerals 4 and 5, resistors; reference numeral 6, an N-channel MOSFET; reference numeral 10, an IGBT; reference numeral 75, a MOS transistor; reference numeral 76, a Zener diode; and reference numeral 77, a resistor. In this embodiment, the gate voltage controlling circuit 8 is constituted by the MCS transistor 75, the Zener diode 76, and the resistor 77. Here, the constituent elements designated with reference numerals 1 to 6, as described above, constitute the maim inverter 100. As shown in the figure, the MOS transistor 75 is connected to the gate voltage detecting circuit 9, and on the basis of the detection signal from the gate voltage detecting circuit 9, serves to output a signal at a HIGH level normally and to output an output signal at a LOW level during the flow of an over-current. The Zener diode 76, as shown in the figure, is connected to the MOS transistor 75. The resistor 77 is connected to the Zener diode 76 and the gate line of the IGBT 10. Since the input control signal is at a HIGH level at the time of turning OFF, the MOS transistor 3 is turned OFF, and the MOS transistor 6 is turned ON. Hence, discharging the gate electric charges in the IGBT 10 through the resistor 5 turns OFF the IGBT 10. Then, in order to suppress a surge voltage which is generated in the abrupt turn-OFF when an over-current is being caused to flow, for example, if the electric charges the quantity of which is substantially the same as that of the electric charges discharged from the gate, or is more than the electric charges discharged from the gate flow into the gate, he gate voltage is not abruptly decreased, and hence it is possible to suppress generation of a surge voltage.

Now, since the MOS transistor 75 is of a P-channel type, it makes the level of the output signal from the gate voltage detecting circuit 9 HIGH normally, and makes the level thereof LOW when an over-current is caused to flow. Thus, since the electric conduction is attained in the MOS transistor 75 only during the flow of an over-current, the voltage which is obtained by subtracting the sum of the breakdown voltage of the Zener diode 76 and the gate voltage from the power source 1 voltage is applied across the resistor 77. The charge current is, as a result, caused to flow into the gate of the IGBT 10 through the resistor 77. This results in that the gate voltage is not abruptly decreased and hence it is possible to prevent generation of a surge voltage.

Now, in the case where the charge current which is caused to flow through the resistor 77 is set less than the discharge current which is caused to flow through the resistor 5, since the gate potential is slowly decreased, the IGBT is slowly cutoff accordingly.

Conversely, in the case where the charge current which is caused to flow through the resistor 77 is set more than the discharge current which is caused to flow through the resistor 5, the gate potential is clamped at a certain potential depending on the breakdown voltage of the Zener diode 76, and hence turn-OFF is not carried out. In this case, since in this embodiment, the output signal of the gate voltage detecting circuit necessarily repeats turning ON and OFF on the basis of the sampling signal; the level of the output signal from the gate voltage detecting circuit 9 goes HIGH until a time point of the next turn-OFF to be recovered to the normal state. Consequently, the output signal will return to the detectable state again in the next turn-OFF state.

Note that, when the MOS transistor 75 is of an N-channel type conversely, if the logic to the gate has only to be inverted, the same effects can be obtained.

As described above, according to this embodiment, the gate voltage controlling circuit 8 includes the MOS transistor 75 which is connected to the gate voltage detecting circuit 9 and the state of which is switched on the basis a the signal from the gate voltage detecting circuit 9, and the Zener diode 76 which is connected between the gate line of the power semiconductor device and the MOS transistor 75. That is to say, since the gate voltage controlling circuit 8 includes the switch the state of which is switched on the basis of the output signal from the gate voltage detecting circuit 9, the Zener diode, and a resistor which may be optionally provided therein, the gate voltage can be slowly decreased or can be clamped to a certain value, Thus, since the IGBT can be slowly turned OFF, it is possible to suppress generation of a surge voltage. In addition, since a period of time from a time point when the level of the input control signal goes HIGH up to the Miller period of time is the delay time similar to the normal turn-OFF case, the control circuit for generating the input control signal has to be designed after due consideration only of the above-mentioned delay time, which makes the simple design possible.

Twentieth Embodiment

Figure 29:
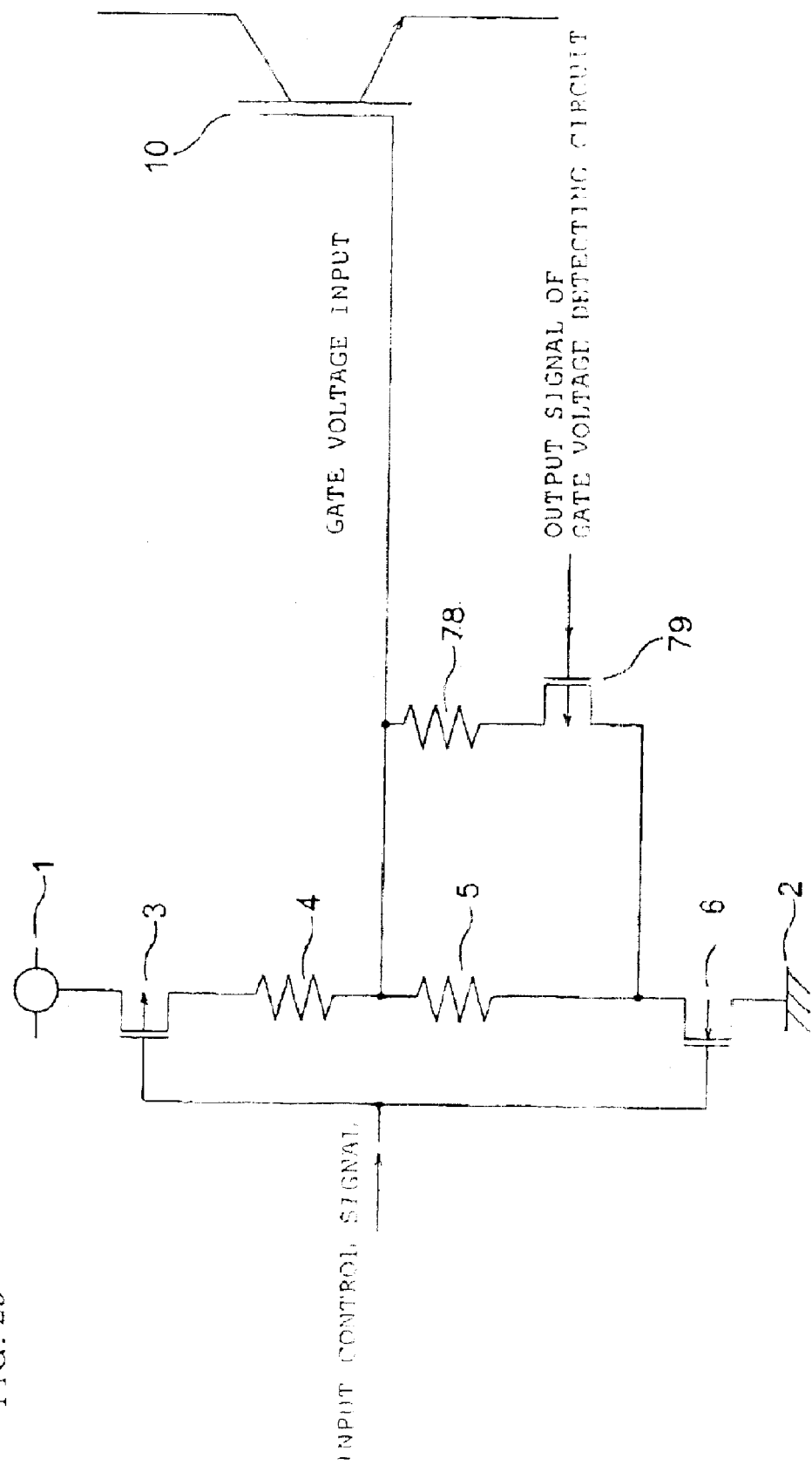
FIG. 29 is a circuit diagram showing a configuration of a gate voltage controlling circuit according to a twentieth embodiment of the present invention.

FIG. 29 is a circuit diagram showing a specific example of the gate voltage controlling circuit 6 different in configuration from that of the nineteenth embodiment. In FIG. 29, reference numeral 1 designates a power source; reference numeral 2, the earth; reference numeral 3, a P-channel MOSFET; reference numerals 4 and 5, resistors; reference numeral 6, an N-channel MOSFET; reference numeral 10, an IGBT; reference numeral 78, a resistor, and reference numeral 79, a MOS transistor. In this embodiment, the gate voltage controlling circuit 8 is constituted by the MOS transistor 79 and the resistor 78. Here, thee constituent elements designated with reference numerals 1 to 6, as described above, constitute the main inverter 100. As shown in the figure, the MOS transistor 79 is connected to the gate voltage detecting circuit 9. The resistor 78, as shown in the figure, is connected to the MOS transistors 79 and the gate line of the IGBT 10.

In this embodiment, in the normal state, the MOS transistor 78 is caused to become a conduction state. In this case, the OFF-resistance of the main inverter becomes the synthesized resistance of the resistors 5 and 78. In addition, since the N-channel MOS transistor 79 goes the conduction state, the gate voltage detecting circuit 9 outputs an output signal at a HIGH level.

Since when an over-current is caused to flow, the gate voltage detecting circuit 9 outputs an output signal at a LOW level the MOS transistor 79 is turned OFF. Thus, the OFF-resistance of the main inverter 100 becomes only the resistance of the resistor 5 and hence the resistance value thereof becomes larger than that in the normal state. This results in that since the discharge current from the IGBT 10 becomes less than that in the normal state, the IGBT 10 is slowly cut off, thereby suppressing generation of a surge voltage.

Figure 30:
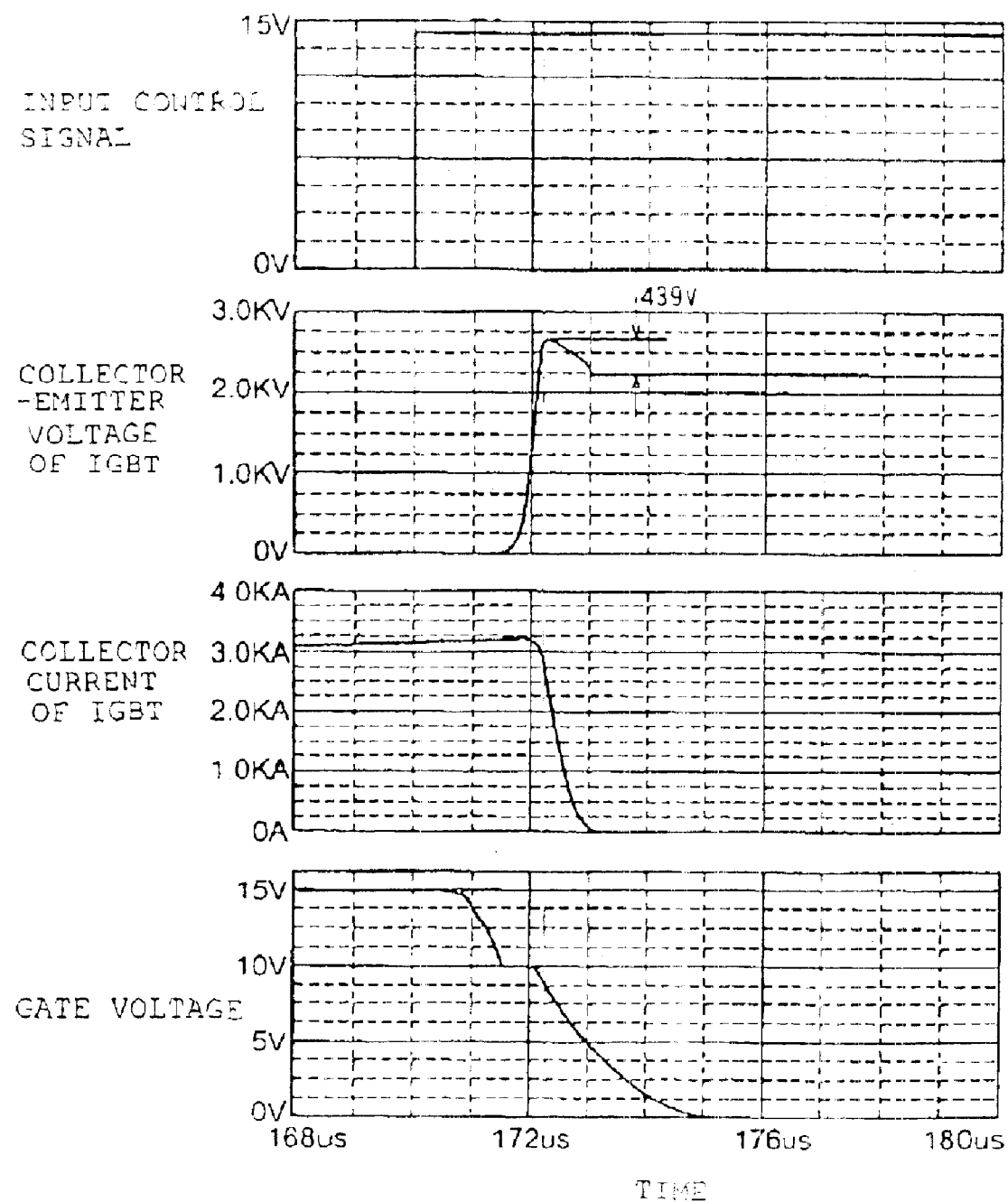
FIG. 30 is a diagram useful in explaining a waveform of an input control signal, a waveform of a collector-emitter voltage, a waveform of a collector current and a waveform of a gate voltage upon turning OFF an IGBT in the case where no control is performed.

FIG. 30 shows a turn-OFF waveform when no constituent element is controlled. As shown in FIG. 30, at the time when the level of the input control signal goes HIGH, the gate voltage begins to be decreased. When it becomes near the end of the Miller period of time, the collector-emitter voltage of the IGBT is abruptly increased. In addition, since the IGBT begins to be cut off, the collector current begins to be abruptly decreased. This causes a large surge voltage to be generated. For example, in the case shown in FIG. 30, a surge voltage of 439V is generated.

Figure 31:
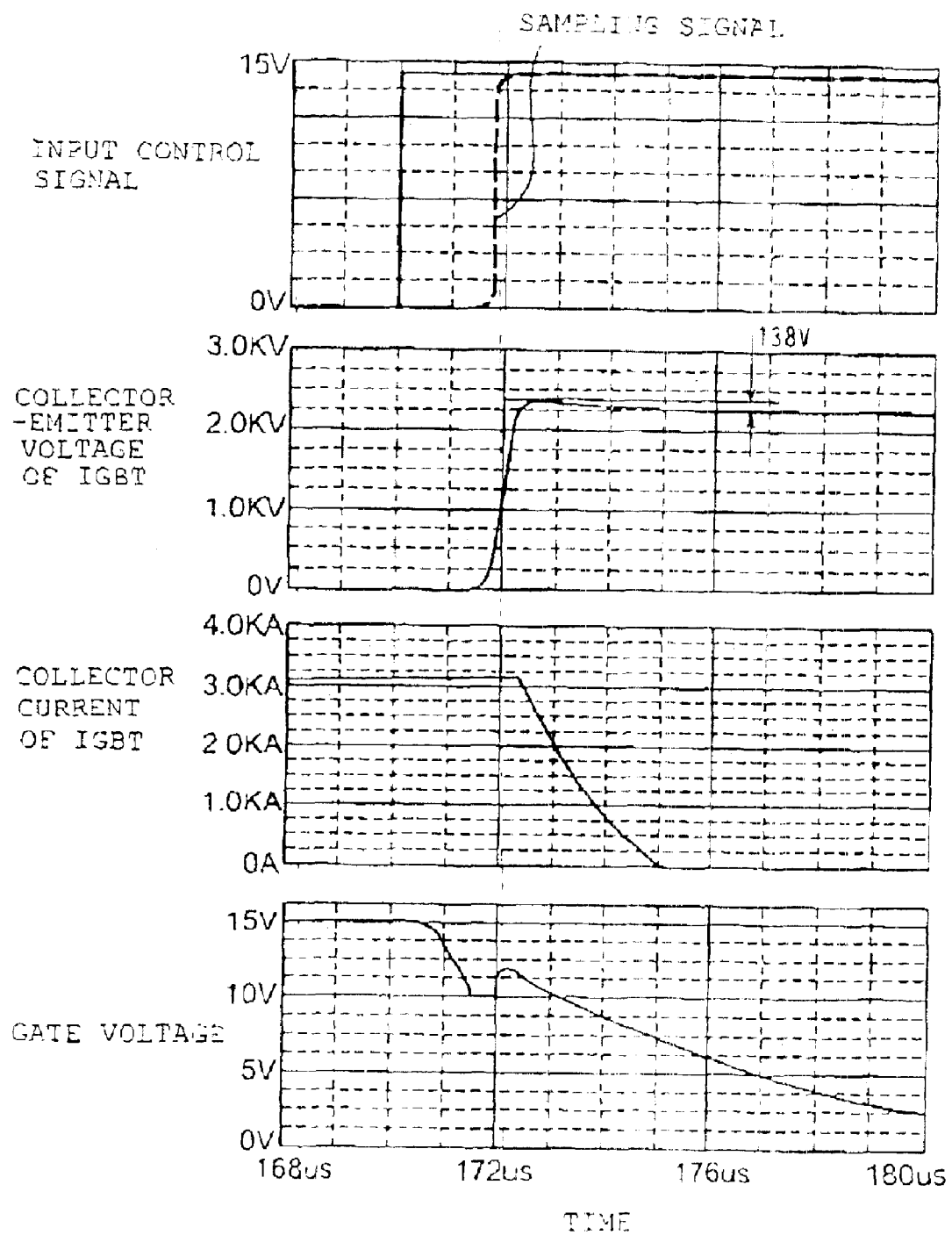
FIG. 31 is a diagram useful in explaining a waveform of an input control signal, a waveform of a sampling signal, a waveform of a collector-emitter voltage, a waveform of a collector current, and a waveform of a gate voltage upon turning OFF an IGBT in the case where control is performed.

On the other hand, FIG. 31 shows a turn-OFF waveform of the IGBT when the gate voltage of the IGBT is controlled using the circuits shown in FIGS. 22 and 29. As shown in FIG. 31, the sampling signal is generated with a delay with respect to the output control signal to enable detection of the voltage during the Miller period of time. In this case, since the current of interest is detected as an over-current, the MOS transistor 79 is turned OFF. Thus, the OFF-resistance of the main inverter 100 becomes only the resistance of the resistor 5, and hence the discharge current begins to be further suppressed as compared with the case of the normal state. Thus, after the gate voltage has been increased once, it is slowly decreased. In the case where the circuit of the twentieth embodiment of the present invention shown in FIG. 31 is used, the generated surge voltage is small, i.e., it is about 136V. That is to say, the surge voltage is suppressed to about 31%.

In addition, as the feature of this embodiment in addition to the above-mentioned effects, as apparent from FIG. 31, the time from a time point when the level of the input control signal goes HIGH up to the Miller period of time is the delay time similar to the normal turn-OFF. Consequently, since the control circuit for generating the input control signal has only to be designed after due consideration of the above-mentioned delay time, the design thereof becomes simple.

Note that, while in this embodiment, only one set of the gate voltage detecting circuit 9, the resistor 78 and the MOS transistor 79 is used, of course, it is similarly possible that a plurality of sets of the gate voltage detecting circuits 9, the resistors 78 and the MOS transistors 79 are arranged in parallel with one another to control the discharge current in a multi-stage manner to change the gate voltage. In this case, the finer control can be carried out.

As described above, in this embodiment, since the sampling signal generating circuit 7 is adapted to generate the sampling signal at time instant near the start of the Miller period of time, the gate voltage detecting circuit 9 can detect the Miller voltage. Then, when the Miller voltage is equal to or larger than a predetermined threshold, it is judged that an over-current is caused to flow through the IGBT 10. Thus, the turn-OFF loss is less. Since during the flow of an over-current, the gate voltage controlling circuit 8 controls the gate voltage in such a way that the IGBT 10 can be slowly cut off, it is possible to reduce a surge voltage which is generated when turning OFF the IGBT 10, and hence it is possible to implement the protection against an over-current.

In addition, the above-mentioned gate voltage controlling circuit is connected to the above-mentioned gate voltage detecting circuit and includes the MOS transistor the state of which is switched on the basis of the gate voltage detecting circuit, and the resistor which is connected between the gate line of the above-mentioned power semiconductor device and the MOS transistor, and also the output terminal from the above-mentioned resistor is coupled to the switch on the OFF side of the above-mentioned main inverter. Thus, it is possible to reduce slowly the gate voltage. Consequently, since the power semiconductor device can be slowly turned OFF, it is possible to suppress generation of a surge voltage. In addition, since the discharge current from the gate of the power semiconductor device is only suppressed, no through current is caused to flow through the above-mentioned circuit for turning ON and OFF the power semiconductor device, and hence the power consumption is not excessively increased. Also, since the time from a time point when the level of the input control signal has goes HIGH up to the Miller period of time is the delay time similar to the normal turn-OFF, the control circuit for generating the input control signal has only to be designed after due consideration of the delay time. This makes the simple design thereof possible.

Twenty-First Embodiment

While in the above-mentioned embodiments, the description is given with respect to the protection system for suppressing a surge voltage generated upon cut-off, since in this-embodiment, there is not provided a means for detecting an over-current when a large over-current such as a short-circuit current continues to flow in the ON state, it is impossible to protect the power semiconductor device. Thus, in order to protect the power semiconductor device from an over-current in an ON state, the combination with other detection circuit and the like is required.

Figure 32:
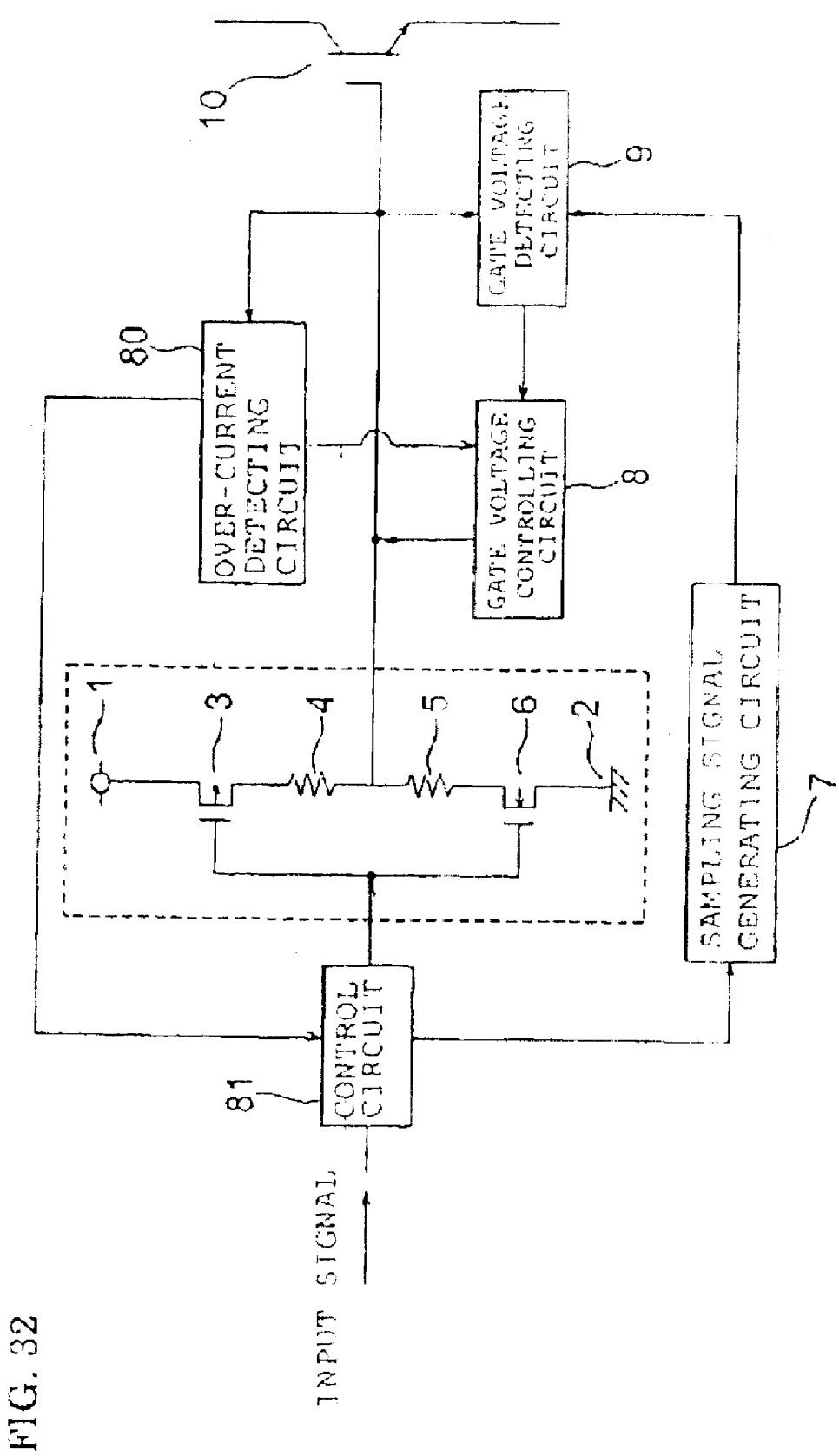
FIG. 32 is a circuit diagram showing a configuration of a drive circuit for a power semiconductor device according to a twenty-first embodiment of the present invention.

FIG. 32 shows an example of the combination with other detection circuit and the like. In the figure, reference numeral 80 designates an over-current detecting circuit for detecting an over-current in an ON state and reference numeral 81 designates a control circuit for outputting an input control signal in response to an input command issued front the outside. In the over-current detecting circuit 80, for example, there is employed the detection system or the like utilizing the increase in gate voltage as shown in the prior art example. When an over-current is caused to flow in an ON state, the over-current detecting circuit 80 outputs a detection signal to the control circuit 81 which in response to the output signal from the over-current detecting circuit 80, cuts off the IGBT 10 in turn. Thus, no over-current is caused to flow for a long period of time and hence it is possible to prevent the apparatus from being destroyed. In addition, the detection signal from the over-current detecting circuit 80 is outputted to the gate voltage controlling circuit 8 at the same time so that the gate voltage controlling circuit 8 is cut off at speed slower than that in the normal case. This results in that it is possible to suppress a surge voltage and hence it is possible to prevent the apparatus from being destroyed.

In addition, even in the case where an over-current is caused to flow, when its level is lower than the detection level of the over-current detecting circuit 80, if a cut-off command is issued thereto, then the gate voltage detecting circuit 9 judges that the current is an over-current, and in response to the detection signal from the gate voltage detecting circuit 9, the gate voltage controlling circuit 8 cuts off the IGBT 10 at slower speed than that in the normal case. This results in that it is possible to suppress a surge voltage, and hence it is possible to prevent the apparatus from being destroyed.

Consequently, by adopting this configuration, even when a large over-current such as a short-circuit current in an ON state or a relatively low over-current which can not be detected by the over-current detecting circuit 80 is caused to flow, it is possible to protect the apparatus.

In addition, the drive circuit for driving a power semiconductor device includes: a switching circuit for receiving as its input an input control signal from the outside to carry out the switching of ON/OFF of the power semiconductor device; a sampling signal generating circuit for detecting the input control signal to output, when the input control signal commands OFF, a sampling signal about at time instant of start of a Miller period of time of the power semiconductor device, or a timing detecting circuit connected to a gate line of the power semiconductor device for detecting the Miller period of time of the power semiconductor device to output a timing signal about at time instant of start of the Miller period of time; a gate voltage detecting circuit connected to the gate line of the power semiconductor device for detecting a Miller voltage of the power semiconductor device at timing when either the sampling signal or the timing signal is inputted thereto to output, when the Miller voltage is equal to or larger than a predetermined threshold, an over-current detection signal; an over-current detecting circuit for detecting a gate voltage in an ON state to detect an over-current on the basis of increase in gate voltage to output an over-current detection signal in an ON state; and a gate voltage controlling circuit connected to the gate line of the power semiconductor device for in response to either the over-current detection signal or the over-current detection signal in an ON state either from the gate voltage detecting circuit or from the over-current detecting circuit, controlling the gate voltage of the power semiconductor device in such a way that the power semiconductor device is turned OFF at slower speed than that in the normal case. Consequently, even when a large over-current such as a short-circuit current in the ON state or the relatively small over-current which can not be detected by the over-current detecting circuit is caused to flow, it is possible to protect the drive circuit.

As set forth hereinabove, according to the present invention, the drive circuit for driving a power semiconductor device includes: a switching circuit for receiving as its input an input control signal from the outside to carry out the switching of ON/OFF of the power semiconductor device; a sampling signal generating circuit for detecting the input control signal to output, when the input control signal commands OFF, a sampling signal about at time instant of start of a Miller period of time of the power semiconductor device; a gate voltage detecting circuit connected to the gate line of the power semiconductor device for detecting a Miller voltage of the power semiconductor device at timing when the sampling signal is inputted thereto to output, when the Miller voltage is equal to or larger than a predetermined threshold, an over-current detection signal; and a gate voltage controlling circuit connected to the gate line or the power semiconductor device for in response to the over-current detection signal from the gate voltage detecting circuit, controlling the gate voltage of the power semiconductor device in such a way that the power semiconductor device is turned OFF at slower speed than that in the normal case. Consequently, both of the gate voltage detecting circuit and the gate voltage controlling circuit are operated only during the turn-OFF state on the basis of the action of the sampling signal generating circuit. In addition, since normally, the power semiconductor device is speedily turned OFF, the turn-OFF loss is less. Also, since the over-current detection level can be changed by adjusting the Miller voltage detection level, it is possible to carry out the over-current protection in which an over-current can be detected even when it is not such a large current as in the prior art example, but is a small current to suppress generation of a surge voltage.

While the present invention has been particularly shown and described with reference to the preferred embodiments, it will be understood that the various changes and modifications will occur to those skilled in the art without departing from the scope and true spirit of the invention. The scope of the invention is, therefore, to be determined solely by the appended claims.

What is claimed is:

1. A drive circuit for driving a power semiconductor device, comprising:

a switching circuit receiving an input control signal for ON/OFF switching of the power semiconductor device;

a sampling signal generating circuit for detecting the input control signal and outputting, when the input control signal commands OFF, a sampling signal substantially at starting of a Miller time period of the power semiconductor device;

a gate voltage detecting circuit connected to a gate line of the power semiconductor device for detecting a Miller voltage of the power semiconductor device when the sampling signal is input to the gate voltage detecting circuit and outputting, when the Miller voltage is at least equal to a threshold, an over-current detection signal; and a gate voltage controlling circuit connected to the gate line of the power semiconductor device for controlling, in response to the over-current detection signal from the gate voltage detecting circuit, gate voltage of the power semiconductor device so that the power semiconductor device is turned OFF more slowly than when no over-current detection signal is output.

2. A drive circuit for driving a power semiconductor device, comprising:
- a switching circuit receiving an input control signal for ON/OFF switching of the power semiconductor device;
- a timing detecting circuit connected to a gate line of the power semiconductor device for detecting a Miller time period of the power semiconductor device and outputting a timing signal substantially at starting of the Miller time period of the power semiconductor device;
- a gate voltage detecting circuit connected to the gate line of the power semiconductor device for detecting a Miller voltage of the power semiconductor device when the timing signal is input to the gate voltage detecting circuit and outputting, when the Miller voltage is at least equal to a threshold, an over-current detection signal; and
- a gate voltage controlling circuit connected to the gate line of the power semiconductor device for controlling, in response to the over-current detection signal from the gate voltage detecting circuit, gate voltage of the power semiconductor device so that the power semiconductor device is turned OFF more slowly than when no over-current detection signal is output.

3. The drive circuit for driving a power semiconductor device according to claim 2, wherein the timing detecting circuit includes:
- a delay circuit having a resistor and a capacitor; and
- a buffer.

4. The drive circuit for driving a power semiconductor device according to claim 2, wherein the timing detecting circuit includes:
- a reference voltage generating circuit for outputting a reference voltage;
- a delay circuit having a resistor and a capacitor; and
- a voltage comparator for detecting whether an output voltage from the delay circuit is larger or smaller than the reference voltage.

5. The drive circuit for driving a power semiconductor device according to claim 3, wherein the timing detecting circuit further includes a diode which is connected in parallel with the resistor so that the input control signal direction is a forward conducting direction of the diode.

6. The drive circuit for driving a power semiconductor device according to claim 2, wherein an output time period in the timing detecting circuit is shorter than the Miller time period of the power semiconductor device.

7. The drive circuit for driving a power semiconductor device according to claim 2, wherein an output time period in the timing detecting circuit falls within a fixed time period from a time point when the gate voltage begins to decrease in accordance with an OFF-command of the input control signal.

8. The drive circuit for driving a power semiconductor device according to claim 2, wherein an output times period in the timing detecting circuit depends on a power source voltage and becomes later in time as the power source voltage decreases.

9. The drive circuit for driving a power semiconductor device according to claim 2, wherein the gate voltage detecting circuit comprises:
- a voltage amplifier connected to the gate line of the power semiconductor device for amplifying the gate voltage to a level; and
- a switch connected to the voltage amplifier and switched based on a signal output from one of the sampling signal generating circuits and the timing detecting circuit.

10. The drive circuit for driving a power semiconductor device according to claim 2, wherein the gate voltage detecting circuit comprises:
- a reference voltage generating circuit for outputting a reference voltage;
- a voltage comparator connected to the gate line of the power semiconductor device for detecting whether the gate voltage of the power semiconductor device is larger or smaller than the reference voltage; and
- a switch connected to the voltage comparator and switched based on a signal output from one of the sampling signal generating circuit and the timing detecting circuit.

11. The drive circuit for driving a power semiconductor device according to claim 1, wherein the gate voltage detecting circuit outputs the over-current detecting signal when a current at least equal to a certain value flows, without changing detection level with respect to an over-current even when the Miller voltage changes due to a change in a power source voltage of the drive circuit.

12. The drive circuit for driving a power semiconductor device according to claim 1, wherein the gate voltage detecting circuit outputs the over-current detection signal when a current at least equal to a certain value flows, without changing detection level with respect to an over-current even when temperature of the drive circuit changes.

13. The drive circuit for driving a power semiconductor device according to claim 1, wherein the gate voltage controlling circuit comprises:
- a MOS transistor connected to the gate voltage detecting circuit and switched based on a signal output from the gate voltage detecting circuit; and
- a Zener diode connected between the gate line of the power semiconductor device and the MOS transistor.

14. A drive circuit for driving a power semiconductor device according to claim 1, wherein
the gate voltage controlling circuit comprises:
- a MOS transistor connected to the gate voltage detecting circuit and switched based on a signal output from the gate voltage detecting circuit; and
- a resistor connected between the gate line of the power semiconductor device and the MOS transistor; and
an output from the MOS transistor is coupled to a switch on an OFF side of the switching circuit.

15. A drive circuit for driving a power semiconductor device, comprising:
- a switching circuit receiving an input control signal for ON/OFF switching of the power semiconductor device;
- a sampling signal generating circuit for detecting the input control signal and outputting, when the input control signal commands OFF, a sampling signal substantially at starting of a Miller time period of the power semiconductor device;
- a gate voltage detecting circuit connected to a gate line of the power semiconductor device for detecting a Miller voltage of the power semiconductor device when the sampling signal is input to the gate voltage detecting circuit and outputting, when the Miller voltage is at least equal to a threshold, an over-current detection signal;
- an over-current detection circuit which detects a gate voltage in an ON state and outputs an over-current detection signal in the ON state by detecting an over-current based on an increase in gate voltage; and
- a gate voltage controlling circuit connected to the gate line of the power semiconductor device for controlling, in response to one of the over-current detection signal from the gate voltage detecting circuit and the over-current detection signal in the ON state from the over-current detection circuit, the gate voltage of the power semiconductor device so that the power semiconductor device is turned OFF more slowly than when no over-current detection signal is output.

16. The drive circuit for driving a power semiconductor device according to claim 1, wherein the sampling signal generating circuit includes:
   a delay circuit having a resistor and a capacitor; and
   a buffer.

17. The drive circuit for driving a power semiconductor device according to claim 1, wherein the sampling signal generating circuit includes:
   a reference voltage generating circuit for outputting a reference voltage;
   a delay circuit having a resistor and a capacitor; and
   a voltage comparator for detecting whether an output voltage from the delay circuit is larger or smaller than the reference voltage.

18. The drive circuit for driving a power semiconductor device according to claim 16, wherein the sampling signal generating circuit further includes a diode which is connected in parallel with the resistor so that the input control signal direction is a forward conducting direction of the diode.

19. The drive circuit for driving a power semiconductor device according to claim 1, wherein an output time period in the sampling signal generating circuit is shorter than the Miller time period of the power semiconductor device.

20. The drive circuit for driving a power semiconductor device according to claim 1, wherein an output time period in the sampling signal generating circuit falls within a fixed time period from a time point when the gate voltage begins to decrease in accordance with an OFF-command of the input control signal.

21. The drive circuit for driving a power semiconductor device according to claim 1, wherein an output time period in the sampling signal generating circuit depends on a power source voltage and becomes later in time as the power source voltage decreases.

22. The drive circuit for driving a power semiconductor device according to claim 2, wherein the gate voltage detecting circuit outputs the over-current detecting signal when a current at least equal to a certain value flows, without changing detection level with respect to an over-current even when the Miller voltage changes due to a change in a power source voltage of the drive circuit.

23. The drive circuit for driving a power semiconductor device according to claim 2, wherein the gate voltage detecting circuit outputs the over-current detection signal when a current at least equal to a certain value flows, without changing detection level with respect to an over-current even when temperature of the drive circuit changes.

24. The drive circuit for driving a power semiconductor device according to claim 2, wherein the gate voltage controlling circuit comprises:
   a MOS transistor connected to the gate voltage detecting circuit and switched based on a signal output from the gate voltage detecting circuit; and
   a Zener diode connected between the gate line of the power semiconductor device and the MOS transistor.

25. A drive circuit for driving a power semiconductor device according to claim 2, wherein
   the gate voltage controlling circuit comprises:
      a MOS transistor connected to the gate voltage detecting circuit and switched based on a signal output from the gate voltage detecting circuit; and
      a resistor connected between the gate line of the power semiconductor device and the MOS transistor; and
   an output from the MOS transistor is coupled to a switch on an OFF side of the switching circuit.

* * * * *